United States Patent
Von Kanel et al.

(10) Patent No.: US 9,318,326 B2
(45) Date of Patent: Apr. 19, 2016

(54) DISLOCATION AND STRESS MANAGEMENT BY MASK-LESS PROCESSES USING SUBSTRATE PATTERNING AND METHODS FOR DEVICE FABRICATION

(75) Inventors: Hans Von Kanel, Wallisellen (CH); Leonida Miglio, Como (IT)

(73) Assignee: PILEGROWTH TECH S.R.L., Como (IT)

( * ) Notice: Subject to any disclaimer, the term of this patent is extended or adjusted under 35 U.S.C. 154(b) by 0 days.

(21) Appl. No.: 13/643,766

(22) PCT Filed: Apr. 26, 2011

(86) PCT No.: PCT/IB2011/000895
§ 371 (c)(1),
(2), (4) Date: Oct. 26, 2012

(87) PCT Pub. No.: WO2011/135432
PCT Pub. Date: Nov. 3, 2011

(65) Prior Publication Data
US 2013/0037857 A1     Feb. 14, 2013

Related U.S. Application Data

(60) Provisional application No. 61/328,203, filed on Apr. 27, 2010.

(51) Int. Cl.
*H01L 29/12*     (2006.01)
*H01L 21/02*     (2006.01)

(52) U.S. Cl.
CPC ...... *H01L 21/02639* (2013.01); *H01L 21/0237* (2013.01); *H01L 21/0243* (2013.01);
(Continued)

(58) Field of Classification Search
CPC .............. H01L 21/76; H01L 21/02024; H01L 21/02639; H01L 21/0237; H01L 21/02381; H01L 21/0243; H01L 21/02521; H01L 21/02532; H01L 21/02546; H01L 21/0265
USPC .................... 257/19, 190, E21.125; 438/938
See application file for complete search history.

(56) References Cited

U.S. PATENT DOCUMENTS 5,208,821 A     5/1993  Berger et al.
6,287,947 B1 *  9/2001  Ludowise et al. ............. 438/606
(Continued)

FOREIGN PATENT DOCUMENTS

EP     0469790 A1     2/1992
EP     1 184 897 A1   3/2002
(Continued)

OTHER PUBLICATIONS

Fündling et al., "Three-dimensionally structured silicon as a substrate for the MOVPE growth of GaN nanoLEDs", Physica Status Solidi (A), vol. 206, No. 6, Jun. 1, 2009, pp. 1194-1198, XP55002944.
(Continued)

*Primary Examiner* — Peter Bradford
(74) *Attorney, Agent, or Firm* — Novak Druce Connolly Bove + Quigg LLP

(57) ABSTRACT

Structures and methods for producing active layer stacks of lattice matched, lattice mismatched and thermally mismatched semiconductor materials, with low threading dislocation densities, no layer cracking and minimized wafer bowing, by using epitaxial growth onto elevated substrate regions in a mask-less process.

56 Claims, 18 Drawing Sheets

(52) U.S. Cl.
CPC ...... *H01L21/0265* (2013.01); *H01L 21/02381* (2013.01); *H01L 21/02521* (2013.01); *H01L 21/02532* (2013.01); *H01L 21/02546* (2013.01)

(56) References Cited

U.S. PATENT DOCUMENTS

| | | | |
|---|---|---|---|
| 7,589,001 | B2 | 9/2009 | Tadatomo et al. |
| 7,968,361 | B2 | 6/2011 | Osawa et al. |
| 2002/0013036 | A1* | 1/2002 | Gehrke et al. ............. 438/462 |
| 2003/0207518 | A1 | 11/2003 | Kong et al. |
| 2004/0123796 | A1* | 7/2004 | Nagai et al. ............. 117/103 |
| 2004/0152321 | A1* | 8/2004 | Gehrke et al. ............. 438/689 |
| 2007/0120208 | A1* | 5/2007 | Mitra ............. 257/417 |
| 2008/0171424 | A1 | 7/2008 | Li et al. |
| 2008/0197358 | A1* | 8/2008 | Frahm et al. ............. 257/76 |
| 2009/0008648 | A1* | 1/2009 | Biwa et al. ............. 257/76 |
| 2009/0098343 | A1* | 4/2009 | Arena et al. ............. 428/172 |
| 2010/0001375 | A1 | 1/2010 | Yu et al. |
| 2012/0001303 | A1* | 1/2012 | Huang et al. ............. 257/623 |
| 2012/0091465 | A1* | 4/2012 | Krames et al. ............. 257/76 |
| 2012/0217474 | A1* | 8/2012 | Zang et al. ............. 257/13 |
| 2014/0134773 | A1* | 5/2014 | Jain et al. ............. 438/44 |

FOREIGN PATENT DOCUMENTS

| | | |
|---|---|---|
| JP | 2005-353680 A | 12/2005 |
| JP | 2006-036561 A | 2/2006 |
| JP | 2007-273659 A | 10/2007 |
| WO | WO-01/59819 A1 | 8/2001 |
| WO | WO-2006/060599 A2 | 6/2006 |
| WO | WO-2008/057454 A2 | 5/2008 |
| WO | WO-2008/124154 A2 | 10/2008 |
| WO | WO 2010/072273 A1 * | 12/2008 |

OTHER PUBLICATIONS

Shunfeng et al., "GaN and LED structures grown on pre-patterned silicon pillar arrays", Physica Status Solidi, C: Current Topics in Solid State Physics, Wiley—VCH Verlag GMBH & Co., KGAA, DE, vol. 7, No. 1, Jan. 1, 2010, pp. 84-87, XP009150337.

Hammond et al., "The elimination of surface cross-hatch from relaxed, limited-area $Si_{1-x}Ge_x$ buffer layers," Applied Physics Letters, AIP, Amernican Institute of Physics, Melville, NY, US, vol. 71, No. 17, Oct. 27, 1997, p. 2517, XP012018911.

Sökmen et al., "Shallow and deep dry etching of silicon using ICP cryogenic reactive ion etching process", Microsystems Technologies; Micro and Nanosystems Information Storage and Processing Systems, Springer, Berlin, DE, vol. 16, No. 5, pp. 863-870, XP019804469.

Fündling et al., "Gallium nitride heterostructures on 3D structured silicon"; Nanotechnology, IOP, Bristol, GB, vol. 19, No. 40, Oct. 8, 2008, p. 405301, XP020144645.

* cited by examiner

800

A1

B1

C1

D2

1000

1100

1200

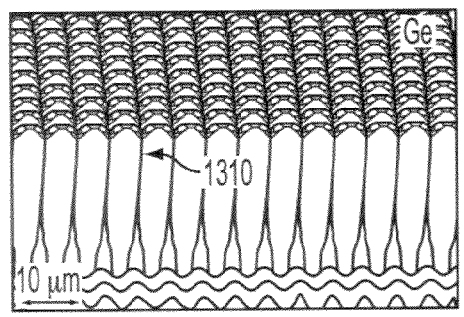 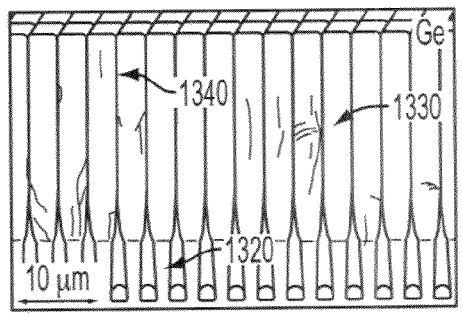
FIG. 13(a)          FIG. 13(b)
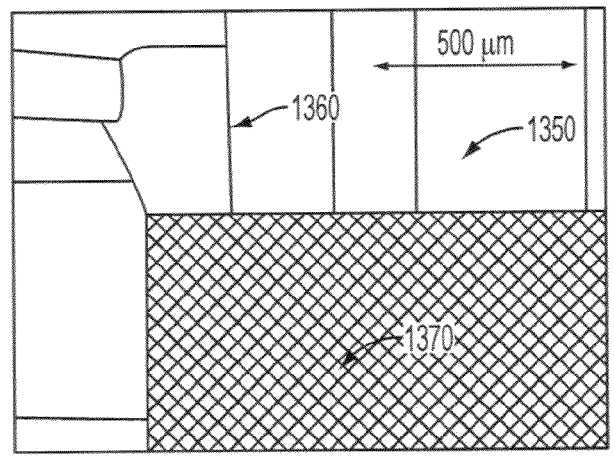
FIG. 13(c)

DISLOCATION AND STRESS MANAGEMENT BY MASK-LESS PROCESSES USING SUBSTRATE PATTERNING AND METHODS FOR DEVICE FABRICATION

CROSS REFERENCE TO RELATED APPLICATIONS

This application is a National Phase filing under 35 U.S.C. §371 of PCT/IB2011/000895 filed on Apr. 26, 2011; and this application claims the benefit of U.S. Provisional Application No. 61/328,203 filed on Apr. 27, 2010; the entire contents of all are hereby incorporated by reference.

FIELD OF THE INVENTION

The invention relates to structures and methods for eliminating threading dislocations, layer cracking and wafer bowing in the epitaxial growth of lattice mismatched and thermally mismatched layers by using patterned substrates. Since materials choice and layer thicknesses are virtually unlimited, the invention can be applied also to the fabrication of devices requiring thick epilayers for their proper functioning, such as multiple junction solar cells, light emitting diodes, semiconductor lasers, radiation imaging detectors and thermo-electric devices. The invention is viable also for the fabrication of microelectronic, opto-electronic and photonic circuits requiring smaller thicknesses of mismatched epilayers.

BACKGROUND OF THE INVENTION

Attempts to extend Moore's Law by introducing new optical and electrical functionalities to the CMOS platform, realization of high-efficiency solid state lighting, manufacturing of concentrator photovoltaic cells, the fabrication of imaging detectors, especially for high-energy electromagnetic and particle radiation, and the fabrication of thermo-electric devices all require—in one form or another—the integration of crystalline materials with dissimilar lattice parameters on top of each other. This can occur basically in two different ways, either by wafer bonding or by "heteroepitaxial growth". This application belongs to the second method of combining materials, especially to materials the lattice parameters of which differ by more than a few tenths of a percent, and which may widely differ in their thermal expansion coefficients.

Problems Related to Lattice Mismatch

When two mismatched materials are grown epitaxially on top of each other, their difference in lattice parameter (misfit) results in mechanical stress, which, when exceeding a certain limit, is relieved either by elastic or plastic relaxation. Under normal circumstances, when a deposit with sufficiently large misfit is made on a single crystalline substrate, stress relaxation can occur elastically, by means of surface corrugation, for example in the form of islands. Elastic relaxation cannot, however, proceed on a flat film. By contrast, for lower misfit, an epitaxial film may remain flat, while stress is relieved plastically by so-called misfit dislocations, once a certain critical film thickness has been exceeded. Eventually, no matter how large the misfit, plastic relaxation by interfacial misfit dislocations always occurs. Whenever an interface with a significant density of misfit dislocations is incorporated in the active region of a device, e.g., a transistor, its performance may be degraded to a large extent. Interfaces containing misfit dislocations therefore usually need to be spatially separated from the active region of a device. Unfortunately, however, keeping interfaces with misfit dislocations at a distance from the active region of a device often does not guarantee its proper performance. In fact, it rarely happens that dislocations are localized exclusively at the interface between the two materials in the form of misfit dislocations. Misfit dislocations are usually rather accompanied by threading arms extending to the surface of the growing film. Also these threading dislocations can be very detrimental to the functioning of a device if they traverse the active region of a heteroepitaxially grown layer stack. The density of threading dislocations should therefore in general be kept as low as possible.

Problems Related to Thermal Expansion Mismatch

The dislocation problem, arising from the lattice misfit, is not the only obstacle to be overcome when epitaxially growing dissimilar materials on top of each other. In many instances the mismatch of the thermal expansion coefficients is equally serious, especially when layers with relatively large thicknesses are needed, for example in devices like high-brightness light emitting diodes for general lighting purposes, multiple junction solar cells, radiation detectors, thermoelectric generators, and many more.

The mismatch of thermal expansion coefficients may lead to wafer bowing upon cooling to room temperature after the epitaxial growth, seriously hampering subsequent processing steps, such as photolithography and patterning, or also further epitaxial growth. The different thermal expansion of epitaxial layers and substrate may even cause the former to crack, either right after epitaxial growth or during any subsequent temperature cycling, which necessarily occurs for example during the operation of concentrator photovoltaic cells (see for example V. K. Yang et al., Journal of Applied Physics 93, 3859 (2003), the entire disclosure of which is hereby incorporated by reference).

The problem of wafer bowing has been addressed in various ways in the past. One approach consisted in introducing interlayers with reduced crystallinity functioning as stress relaxation layers (see for example US patent application number US2008/0308909 to Masahiro Sakai et al., the entire disclosure of which is hereby incorporated by reference). Another approach involved backside coating of the substrate by some material exerting the opposite stress upon wafer cooling (see for example US patent application number US2003/0033974 to Tetsuzo Ueda, the entire disclosure of which is hereby incorporated by reference). Unfortunately, however, reducing wafer bowing may even increase the tendency of the overlayer to crack, because wafer bowing is associated with partial elastic stress relief.

An alternative way for reducing wafer bowing has been described for example in US patent application number US2008/0233716 to Kazuhide Abe, the entire disclosure of which is hereby incorporated by reference. Therein, deep grooves are formed in a silicon carbide film perpendicular to the direction along which bending on a semiconductor wafer occurs, thereby reducing said bending.

In a related approach, a mechanical stress absorbing system has been designed in which about 10 μm deep and 1 μm wide grooves are formed in a support substrate, onto which a nucleation layer is transferred from a transfer substrate by wafer bonding techniques (see for example US patent application number US2006/0216849 to Letertre et al., the entire disclosure of which is hereby incorporated by reference). In order to effectively relieve stress during temperature incursions in thick epitaxial layers grown onto the nucleation layer, a stress absorbing buffer layer is additionally needed underneath the nucleation layer, similar to the interlayer described in US patent application number US2008/0308909 to Masahiro Sakai et al., the entire disclosure of which is hereby incorporated by reference. Stresses are supposed to be absorbed by defect generation, local material displacement or creep, depending on the nature of the buffer layer. These stress relief mechanisms need to be very effective, when layer cracking and wafer bending are to be eliminated, in case of thick epitaxial layers with large lateral dimensions, i.e., extending essentially across the whole wafer. Material displacement or creep would therefore have to occur over macroscopic distances, which is very unlikely to happen in practice.

The same applies to a related approach in which the relaxation of misfit stress in epitaxial SiGe/Si(001) layers is assumed to occur by a slipping process, the SiGe epilayer thereby remaining cubic. Here, a thin SOI substrate is used instead of a bulk silicon substrate (see for example US patent number U.S. Pat. No. 5,759,898 to Ek et al., the entire disclosure of which is hereby incorporated by reference). Despite of a comparatively low viscosity at sufficiently elevated temperatures, it seems highly unlikely that this slipping process would ever happen on a macroscopic scale.

While wafer bowing and layer cracking are severe practical problems arising typically at layer thicknesses beyond 1 µm, threading dislocations, intimately related to plastic strain relaxation, are normally present already at smaller layer thickness for significant lattice misfits of the order of a fraction of a percent or more.

There have been many attempts to lower threading dislocation densities (TDD) in blanket films, such as compositional grading of buffer layers (see for example US patent number U.S. Pat. No. 5,221,413 to Brasen et al., the entire disclosure of which is hereby incorporated by reference). Alternatively, buffer layers containing high defect densities may facilitate dislocation nucleation and annihilation (see for example H. Chen et al., Journal of Applied Physics 79, 1167 (1996), the entire disclosure of which is hereby incorporated by reference).

Still other methods involve epitaxial growth of parts of a layer at different substrate temperatures, one example being a Ge base layer deposited at low substrate temperature, followed by a second Ge layer at higher temperature (see for example US patent number U.S. Pat. No. 6,537,370 to Hernandez et al., the entire disclosure of which is hereby incorporated by reference). The idea behind this was to suppress or at least reduce island formation by the Stranski-Krastanow mechanism at the early stage of growth, since merging islands and rough surfaces result in larger TDDs.

In addition, post-growth thermal annealing was shown to enhance dislocation glide and annihilation. Cyclic thermal annealing appears to be particularly efficient. Here, the temperature is cycled between a first value above the brittle/ductile transition (i.e., close to the melting point of the epitaxial layer) and a second value below the first. A significant reduction of the TDD was observed for example in Ge films epitaxially grown on Si(001) substrates by using this procedure (see for example U.S. Pat. No. 6,635,110 to Luan et al., the entire disclosure of which is hereby incorporated by reference). The method does not, however, solve the problem of wafer bowing and crack formation, when Ge in the form of blanket films is grown to substantial thicknesses of several micrometers, and the TDD still remains very high, of the order of typically $2 \cdot 10^7$ cm$^{-2}$ for 1 µm thick films.

Problem Solving by Limited Area Epitaxy Using Dielectric Masks

Whenever epitaxial layers are grown in the form of continuous films onto a substrate characterized by a significant lattice and thermal expansion mismatch, one is faced with the problems of excessive TDD as soon as the misfit strain starts relaxing plastically, as well as wafer bowing and crack formation at larger thicknesses.

It was realized long ago that a significant further reduction of TDDs can only be achieved by reducing the epitaxial growth area, i.e., by making the epitaxial structures small. This can be achieved by providing the substrate with a dielectric mask, exposing the substrate surface only within openings previously defined by lithography and etching. The idea behind is, that with sufficient layer thickness, threading arms arising from the interface will exit the sides of the epitaxial structure, rather than reaching the upper surface.

The concept was applied to various semiconductor combinations, such as Si, Ge, III-V materials, II-VI materials (see for example UK patent application number GB2 215 514 to Goodfellow et al.). Similarly, the concept was applied to GaAs mesas grown into oxide openings on Si(001) by molecular beam epitaxy (MBE) or chemical vapour deposition (CVD), any material deposited on the oxide mask being removed in a chemical etching step (see for example U.S. Pat. No. 5,158,907 to Fitzgerald, the entire disclosure of which is hereby incorporated by reference). The technique, also termed "epitaxial necking", was shown to be effective not only in reducing TDDs in GaAs mesas grown on Si by MBE, but also in eliminating cracks (see for example Fitzgerald et al., Journal of Electronic Materials 20, 839 (1991), the entire disclosure of which is hereby incorporated by reference).

The idea of causing defects to terminate at non-crystalline sidewalls, has, in addition to "epitaxial necking", become known also under the name of "Aspect ratio trapping (ART)" (see for example International patent application number WO2008030574 to Bai et al., the entire disclosure of which is hereby incorporated by reference). Limiting the epitaxial growth area, in combination with the cyclic thermal annealing mentioned before, was also shown to lead to a drastic reduction of TDDs in Ge mesas grown epitaxially on Si(001) (see for example US patent number U.S. Pat. No. 6,635,110 to Luan et al., the entire disclosure of which is hereby incorporated by reference).

Limited area epitaxy, even when combined with thermal annealing, is not, however, sufficient by itself for complete removal of threading dislocations, even when feature sizes are kept very small. To understand this, it is necessary to consider the nature of the dislocations. In cubic semiconductors the most common dislocations are so-called 60-degree dislocations, where Burgers vectors and dislocation lines enclose an angle of 60 degrees with one another, and are both located in {111} glide planes (see for example Blakeslee, Mat. Res. Soc. Symp. Proc. 148, 217 (1989), the entire disclosure of which is hereby incorporated by reference). Such dislocations can reach the edge of epitaxial regions by gliding under the influence of stress, or simply reach the interface to the dielectric once the epitaxial structure is sufficiently high, such that their glide plane no longer cuts through the growth front. There are, however, also so-called sessile dislocations with dislocation lines perpendicular to the interface. They are not affected by stress, and can only be induced to deflect from their vertical orientation by interacting with inclined surface facets. It has indeed been shown that the mechanism of dislocation deflection is present in facetted GaN islands, and can lead to a significant reduction of the TDD (see for example Knoke et al., J. Cryst. Growth 310, 3351 (2008), the entire disclosure of which is hereby incorporated by reference). Surface faceting is expected to have the same effect for group IV and for compound semiconductors (see for example International patent application number WO2008030574 to Bai et al., the entire disclosure of which is hereby incorporated by reference).

Instead of forming limited epitaxial regions in the form of mesas it has been argued that large area heteroepitaxy of mismatched materials with low TDDs should be possible by introducing dislocation sinks in the form of substrate pits. This provides the additional advantage of substantially planar surfaces (see for example European patent application number EPO 505 093 to Bean et al., the entire disclosure of which is hereby incorporated by reference).

A further extension of the technology of TDD reduction involved combining the described patterning by means of dielectric masks with selective epitaxy, followed by epitaxial lateral overgrowth (ELO). For the example of Ge on Si(001) it was argued that by continuing the process until coalescence one may hope to obtain essentially defect-free blanket films (see for example Langdo et al., Applied Physics Letters 76, 3700 (2000), the entire disclosure of which is hereby incorporated by reference). Obviously, however, the problems of wafer bowing and layer cracking would come into play upon increasing the layer thickness further.

In addition, for epitaxial necking to be efficient, the aspect ratio between the height and width of the mask openings should at least be approximately equal to one. For films with thicknesses below about 1 µm it is therefore necessary to use submicron-lithography for defining the size of the mask openings. Even smaller dimensions of the openings are required when elastic relaxation is to contribute significantly to the relaxation of the misfit strain (see for example US patent application number US2008001169 to Lochtefeld et al., the entire disclosure of which is hereby incorporated by reference).

All methods relying on the epitaxial growth into dielectric windows are furthermore limited by the heights of window sidewalls, since the masks cannot be made arbitrarily thick. This also limits the heights of the regions where dislocation trapping may occur.

Still an alternative approach involved the use of selective epitaxial growth on protrusions of crystalline substrate material surrounded by a dielectric mask rather than growth into pits formed in such a mask. In this approach, a buffer layer of Si nanowires is formed on a Si substrate, the nanowires standing perpendicular to the substrate surface and being surrounded by dielectric material through which they protrude. A compound semiconductor is selectively deposited onto the nanowire tips, followed by ELO until a continuous compound semiconductor layer is formed (see for example US patent application number US2008149941 to Li et al., the entire disclosure of which is hereby incorporated by reference). While this approach may as well be effective in reducing the TDD in the compound semiconductor layer, it cannot eliminate the problems associated with the thermal mismatch, when the compound semiconductor layer extends across the whole wafer. As described before, the compound semiconductor layer would have to slip across the substrate over macroscopic distances during cooling from the growth temperature. This is not likely to happen in practice, since neither is a dielectric layer arbitrarily soft, nor could the Si nanowires withstand the shear forces occurring during cooling.

The technology described above, i.e., substrate patterning allowing for "epitaxial necking" or ART, has been applied to the fabrication of electronic and optoelectronic devices made from lattice mismatched materials (see for example US patent application number US2009039361 to Li et al., the entire disclosure of which is hereby incorporated by reference).

The possibility to replace Ge-wafers by Si-wafers as substrates for multi-junction solar cells has been identified as another important application of ART. This application implies the epitaxial growth of relatively thick layer stacks, unless cells are grown on both sides of the substrate. In this latter approach, taking the example of a triple-junction cell, the sub-cell with an intermediate bandgap of about 1.1 eV is made from the Si substrate, while the sub-cell with the largest bandgap is typically made from InGaP, by an ART process applied for example to the top surface, as well as the sub-cell with the smallest bandgap by another ART process on the bottom surface of the substrate (see for example US patent application number US2009065047 to Fiorenza et al., the entire disclosure of which is hereby incorporated by reference). The approach of fabricating sub-cells on both sides of a Si-wafer minimizes the problem of thermal layer cracking because of relatively thin epilayers. The narrow trenches of 300-500 nm typically used in ART may in addition allow for some elastic relaxation, as well as the somewhat compliant nature of the $SiO_2$ mask. In view of frequent thermal cycling during solar cell operation, it may, however, still be disadvantageous to have a structure composed of laterally varying thermal properties. Moreover, the concept requires the use of wetting layers, which, in addition to the dislocation trapping regions, absorb some of the solar radiation, thus lowering the cell efficiency.

The problems with thermal mismatch appear to become even more significant when multi-junction solar cells are grown on the same side of a Si substrate by using ART and ELO processes. It has been suggested to replace the conventional triple-junction cell, featuring a bottom sub-cell made from Ge, by a triple-junction in which all sub-cells are made entirely from III-V materials (see for example International patent application number WO2010033813 to Fiorenza et al., the entire disclosure of which is hereby incorporated by reference). Although the Ge no longer acts as an active material in this type of cell, it was nevertheless suggested to form first a coalesced Ge layer by an ART+ELO process, before growing the active III-V layer stack. Coalescence is, however, accompanied by the generation of large TDDs in the regions where the growth fronts from neighbouring windows meet. This serious problem encountered in continuous layer formation by ART+ELO has not been solved to date (see for example Fiorenza et al., ECS Transactions 33, 963 (2010), the entire disclosure of which is hereby incorporated by reference). Furthermore, the coalesced Ge layer and the active III-V layers together, are necessarily at least 5 µm thick, such that wafer bowing and layer cracking must be expected to become serious obstacles during further device processing and solar cell operation.

Growth on Mask-Less Patterned Surfaces

Approaches Leading to Continuous Layers

In an alternative class of patterning procedures the dielectric mask material is removed from the substrate wafer before epitaxial growth begins, or, alternatively, the patterning is performed without any mask at all. For Si substrates this is possible by using an electrochemical process called anodization, by means of which porous Si is formed. Such porous Si substrates have been used in the fabrication of group III nitride layers, with a Ge layer deposited on the porous Si substrate before the compound semiconductor layers (see for example US patent application number US2005199883 to Borghs et al., the entire disclosure of which is hereby incorporated by reference). The Ge interlayer was believed to reduce the thermal stress arising from the difference in thermal expansion parameters of the Si substrate and group III-nitride material. The porous Si layer on the other hand should accommodate the large lattice mismatch of the Si substrate and the nitride layer. As a result, fewer dislocations should be present in the nitride film, and layer cracking and substrate bowing should be avoided. While these arguments are valid on a small scale, they have to fail to a large extent on a wafer scale, since a continuous group III-nitride layer would have to slip across the substrate by macroscopic distances during cooling from the growth temperature.

Alternatively, an epitaxial layer may be grown on a flat substrate first. Hereafter, stripes are etched into the layer in a manner in which part of the substrate is removed in between the remaining stripes. In a following selective growth process the material grows laterally from the remaining stripes, forming a suspended film over the etched substrate regions. The process, termed "pendeo-epitaxy", was first applied to epitaxial GaN layers on SiC substrates (see for example T. Zheleva et al., Journal of Electronic Materials 28, L5 (1999), the entire disclosure of which is hereby incorporated by reference). While TDDs can be drastically reduced by the pendeo-epitaxy process, the problems associated with the thermal expansion mismatch remain for the same reasons as in all other approaches in which continuous layers are eventually formed on a thermally mismatched substrate.

In a further approach, the substrate was patterned in a way such as to form an array of weak posts of submicron size and with an aspect ratio above 0.5. A continuous GaN layer was then grown on top of the posts by pendeo-epitaxial methods (see for example US patent number U.S. Pat. No. 6,380,108 to Linthicum et al., the entire disclosure of which is hereby incorporated by reference). The weak posts are configured to crack due to the thermal expansion coefficient mismatch between the substrate and the GaN layer. Upon cooling from the growth temperature at least some of the weak posts should hence crack, thereby relieving stress in the GaN layer. The problem here is again that in order to be effective on a wafer scale, the majority of the posts would have to crack, leading to layer separation from the substrate. While this may indeed be desirable in some applications, it is inconceivable to avoid layer separation and yet release the stress on a wafer scale, again for the same reasons as explained above.

Approaches Involving Nanorods

As explained above, irrespective of the details of the fabrication procedure it has hardly been possible by prior art techniques to substantially reduce the TDD, and eliminate layer cracking and wafer bowing in the case of continuous layers, unless the total layer thickness is kept comparatively low. Upon relaxing the limited film thickness constraint, the only option to tackle all of these problems appears therefore to be one in which layer coalescence is avoided altogether. Besides providing a solution to the practical problems of layer cracking, wafer bowing and dislocation reduction, the use of discontinuous films may have other advantages. One such advantage is the possibility to employ larger In contents in the active layer of group III-nitride LEDs, without deteriorating the internal quantum efficiency, and, simultaneously achieving higher light extraction efficiency, as shown for InGaN quantum well active regions incorporated into GaN nanorods (see for example US patent application number US2007077670 to Kim et al., the entire disclosure of which is hereby incorporated by reference).

In the latter example a GaN buffer layer was first grown on planar sapphire wafers by an MOCVD process known to those working in the field. The nanorods were subsequently formed by using low substrate temperatures favouring vertical over lateral growth.

Instead of letting nanorods nucleate spontaneously, precise position control of nano-LEDs was obtained by patterning a substrate prior to nitride semiconductor growth. This has been demonstrated for example on Si(111) substrates, patterned in the form of an array of pillars of submicron size, and a height of about 5 μm. In this prior art the height of the epitaxial structures formed on mask-less substrates was comparatively small (less than 2 microns) and MOCVD deposition occurred equally in between the Si pillars (see for example Fondling et al., Physica Status Solidi A 206, 1194 (2009), the entire disclosure of which is hereby incorporated by reference). For the AlGaN/InGaN material system nitrogen-rich growth conditions and plasma-assisted MBE are necessary to favour vertical with respect to lateral growth rates to the extent necessary for nanowires to grow (see for example Stoica et al., small 4, 751 (2008), the entire disclosure of which is hereby incorporated by reference). For many devices it is, however, desirable to achieve structure heights of more than a micron. Some devices even require considerably larger height (or layer thickness), such as multiple-junction solar cells, especially for example triple junction solar cells of the conventional kind with Ge forming the bottom sub-cell. Yet taller structures of dozens of microns are necessary for example for X-ray detection.

An attractive way to achieve columnar growth in the AlGaN/InGaN material system has been found to be possible by means of low-energy plasma-enhanced vapour phase epitaxy (LEPEVPE) (see for example WO2006097804 to von Karla the entire disclosure of which is hereby incorporated by reference).

It is an object of the present invention to provide means by which lattice matched and lattice mismatched semiconductor layers can be grown epitaxially in a mask-less process on pre-patterned substrates.

It is another object of the present invention to provide means by which semiconductor layers can be grown epitaxially in a mask-less process on pre-patterned substrates with different thermal expansion coefficients.

It is another object of the present invention to provide means by which lattice mismatched semiconductor layers with a low threading dislocation density can be grown epitaxially in a mask-less process on pre-patterned substrates.

It is another object of the present invention to provide means by which thermally mismatched, crack-free semiconductor layers can be epitaxially grown in a mask-less process on pre-patterned substrates.

It is another object of the present invention to provide means by which thermally mismatched semiconductor layers can be grown in a mask-less process on pre-patterned substrates without causing substrate bowing.

It is another object of the present invention to provide means by which growth of lattice and thermally mismatched semiconductor layers is restricted to the elevated regions of pre-patterned substrates.

It is another object of the present invention to provide means for fabricating semiconductor light emitting diode structures, monolithically integrated on thermally and lattice mismatched, pre-patterned substrates in a mask-less process.

It is another object of the present invention to provide means for fabricating microelectronic circuits monolithically integrated on thermally and lattice mismatched, pre-patterned substrates in a mask-less process.

It is another object of the present invention to provide means for fabricating semiconductor laser structures, monolithically integrated on thermally and lattice mismatched, pre-patterned substrates in a mask-less process.

It is another object of the present invention to provide means for fabricating imaging detectors, such as infra-red and X-ray pixel detectors, monolithically integrated on thermally and lattice mismatched, pre-patterned substrates in a mask-less process.

It is another object of the present invention to provide means for fabricating thermo-electric devices monolithically integrated on thermally and lattice mismatched, pre-patterned substrates in a mask-less process.

It is another object of the present invention to provide means for fabricating multi-junction solar cells, monolithically integrated on thermally and lattice mismatched, pre-patterned substrates in a mask-less process.

It is another object of the present invention to provide means for monolithically integrating devices requiring lattice and/or thermally mismatched semiconductor layers onto pre-patterned, CMOS-processed substrates in a mask-less process.

It is another object of the present invention to provide means for monolithically integrating devices requiring lattice and/or thermally mismatched semiconductor layers in a back-end CMOS-process.

SUMMARY OF THE INVENTION

The present invention provides means for fabricating active layer stacks of lattice matched, lattice mismatched and thermally mismatched materials on patterned substrates in mask-less processes. Substrates are patterned in the form of elevated regions, separated by narrow channels, the depths of which may exceed the smallest dimensions of elevated regions. A combination of elastic stress relaxation, and elimination of threading dislocations by annihilation, glide towards the edges of said elevated regions, line extension on slip planes during growth, or dislocation line deflection by surface faceting, minimizes threading dislocation densities. Layer cracking is prohibited, and wafer bowing minimized, by avoiding material grown onto elevated substrate regions to merge. The invention can be applied to the fabrication of monolithically integrated photonic, opto-electronic, micro-electronic and thermo-electric devices on lattice mismatched substrates.

BRIEF DESCRIPTION OF THE DRAWINGS

FIG. 13(a) is a SEM image in perspective view of tall pillars.

FIG. 13(b) is a SEM image in perspective view of tall ridges.

FIG. 13(c) is a SEM image in plan view of the tall pillars shown in FIG. 13(a).

DETAILED DESCRIPTION OF THE PREFERRED EMBODIMENT(S)

As described above, the present invention relates to the monolithic integration especially of lattice mismatched and/or thermally mismatched semiconductor layers in an epitaxial growth process, and to devices made from monolithically integrated semiconductor structures. In particular, the invention relates to layer/substrate combinations with different lattice parameters and thermal expansion coefficients. Although the invention relates foremost to the monolithic integration of electronic, opto-electronic and photonic functionalities on a silicon (Si) substrate or silicon-on-insulator (SOI) substrate, it applies also to the integration of functional layers and devices fabricated on other substrate materials, such as germanium (Ge), germanium-on-insulator (GeOI), gallium arsenide (GaAs), indium phosphide (InP), indium antimonide (InSb), cadmium telluride (CdTe), silicon carbide (SiC), sapphire ($Al_2O_3$), aluminium nitride (AlN), gallium nitride (GaN), or any other single crystal substrate.

The semiconductor materials monolithically integrated onto anyone of these substrates can for example be a group IV material, like C, Si, Ge, Sn, and combinations thereof, or any compound semiconductor materials. Compound semiconductor materials may be III-V materials, for example nitrides like GaN, AlN, InN and their alloys; or arsenides, like AlAs, GaAs, InAs and their alloys; or phosphides, like AlP, GaP, InP and their alloys; or antimonides, like GaSb, InSb, and their alloys. The compound semiconductor materials may also be alloys of group III phosphides and aresenides. Alternatively, compound semiconductor materials may be II-VI materials, for example sulphides, like ZnS, CdS and their alloys; or selenides, like ZnSe, CdSe, and their alloys; or tellurides, like ZnTe, CdTe, HgTe, and their alloys. The compound semiconductor materials may also be alloys of group IV sulphides, selenides and tellurides, such as PbS, PbSe, and PbTe, or any combination thereof.

Figure 1A:
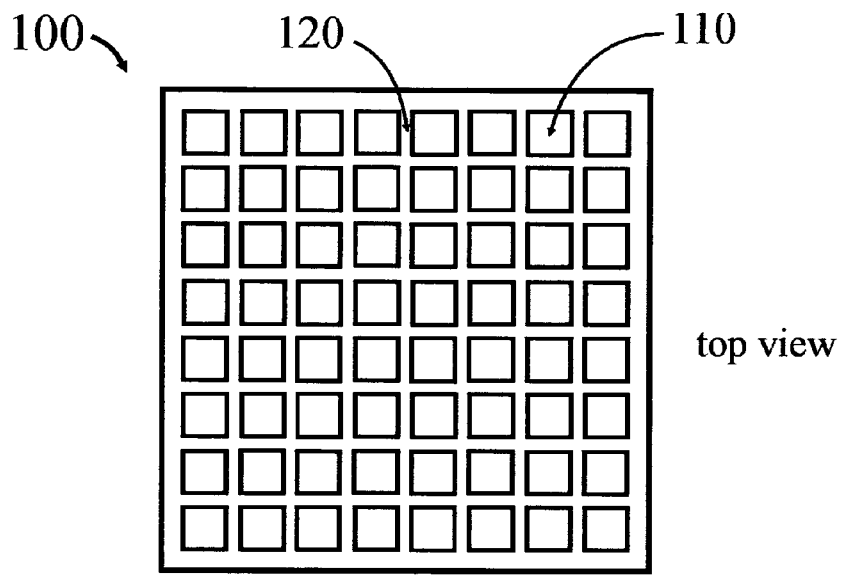
FIG. 1(a) to FIG. 1(b) are schematic views of a patterned wafer in top view and in cross-section.
Figure 1A:
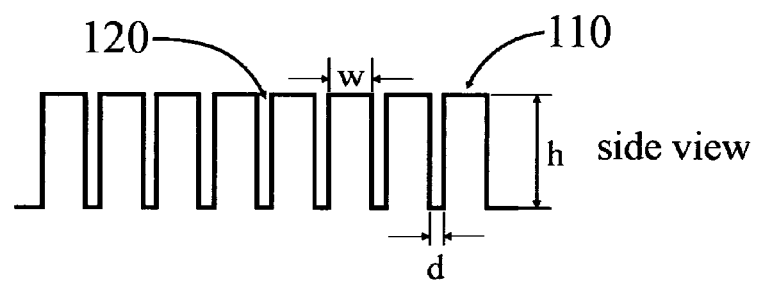
Figure 1B:
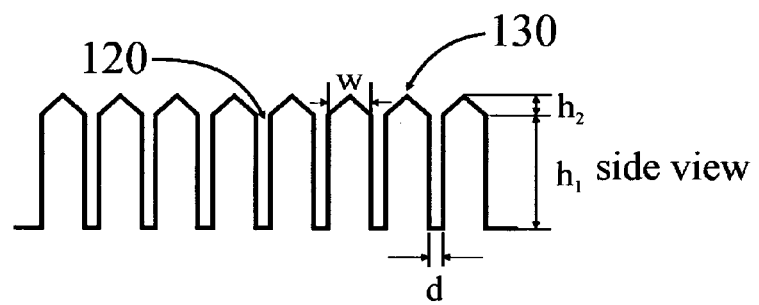

A first embodiment of the invention is shown schematically in FIGS. 1(a) and 1(b). A substrate 100 is patterned in the form of two sets of perpendicular grooves or trenches 120, leaving in between elevated regions 110 as shown in FIG. 1(a). Elevated regions 110 may for example be of square shape, with w indicating the dimension of the squares. The grooves 120 of width d are etched to a depth h. The width d of the grooves may be smaller or larger than the sides w of the squares. The etch depth h is preferably about equal to or larger than the width d of the grooves. In one preferred aspect of the embodiment, the depth h is much larger than the width d of the grooves, for example up to ten times as large.

The substrate patterning may take place by means of lithography and etching steps well known to experts in the field. First, a lithography step is used to define the pattern. Depending on the size of the features to be etched into the substrate, either optical photolithography, or holographic exposure, or X-ray lithography, or electron beam lithography, or nano-imprinting, may be used. The exposed pattern may then be transferred to the substrate by wet chemical or dry etching steps. Especially the patterning of Si wafers is very well known to anyone working in the field. Grooves 120 may be etched to depths h of many microns, for example by deep reactive ion etching (DRIE) (see for example the "Bosch process" described in US patent number U.S. Pat. No. 5,501, 893 to Laermer et al., the entire disclosure of which is hereby incorporated by reference). Depending on the lithography and etching process used, the size w of elevated regions 110 may vary from a sub-micron scale, for example 100 nm, to a scale of many micrometers, for example 10 µm. For some applications size w of elevated regions 110 may be chosen to be even larger, for example up to 100 µm or even 500 µm. The width d of grooves 120 may likewise vary from a few tens of nanometers to a few micrometers, for example 2-5 µm. The etch depth h may vary from a fraction of a micrometer to a few micrometers, or even many micrometers, for example 20 µm. It is advisable to keep the aspect ratio h/w about equal to one or even larger than one, in a preferred aspect of the embodiment even much larger than one, such as for example ten.

Figure 3A:
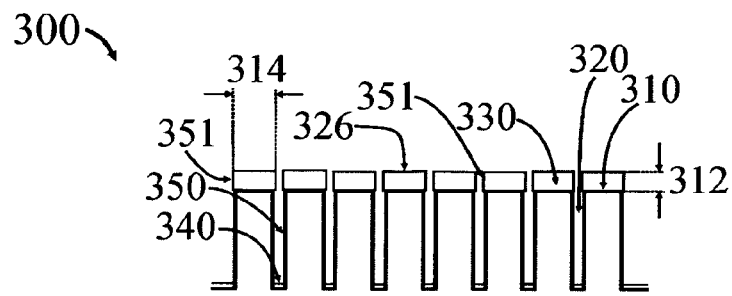
FIG. 3(a) to FIG. 3(c) are schematic cross-sections of a patterned wafer after epitaxial growth without and with surface faceting, and after renewed surface flattening.

Another aspect of the embodiment is shown in FIG. 1(b). Here, elevated substrate regions 130 may be facetted instead of being flat. Vertical grooves 120 may have height $h_1$, and the facets may extend to height $h_2$. Surface facets 130 may be formed by etching and/or deposition techniques well known to experts working in the field. Elevated substrate regions 130 may be advantageous for the deflection of dislocations towards the edges of epitaxial patches during the growth (please see also FIG. 3).

Figure 2:
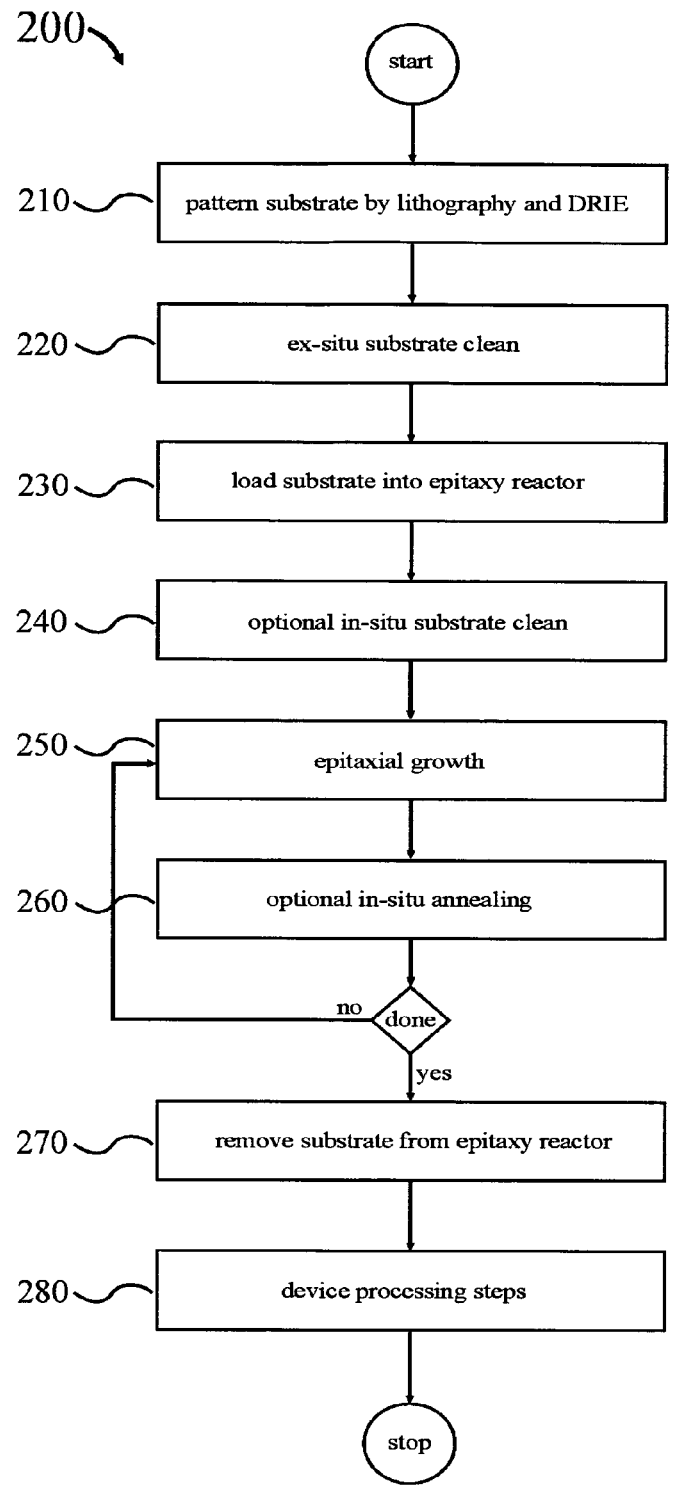
FIG. 2 is a schematic process flow.

Referring now to FIG. 2, a process sequence 200 may include steps of patterning a substrate, 210, ex-situ cleaning the patterned substrate by methods well known to anyone working in the field, including for example an optional step of surface passivation, 220, loading the substrate into the epitaxial reactor, 230, and performing an optional in-situ cleaning step 240. This cleaning step 240 may consist of any number of sub-steps well known to anyone working in the field, such as thermal annealing steps, designed to remove physisorbed hydrocarbon molecules and moisture, or annealing in the presence of a flow of hydrogen gas, or thermal desorption of a thin surface oxide in UHV. The temperature of the clean substrate is then adjusted in accordance with the needs of the first epitaxy step 250, which may consist of the epitaxial growth of a lattice-matched material, such as the substrate material itself, or of a lattice mismatched, or of a thermally mismatched material, followed by an optional annealing step 260. The substrate temperature may then be readjusted according to the needs of a second epitaxy step 250 of a lattice mismatched and/or thermally mismatched material. Depending on the epitaxial growth technique and the process parameters used, the vertical growth rate may be chosen to be higher than the lateral growth rate during epitaxy step 250. In a preferred aspect of the embodiment, the vertical growth rate may be chosen to be even much higher than the lateral growth rate, for example ten times as high or even more. In accordance with FIG. 3(a), most of the semiconductor material may be deposited in the form of isolated patches 330 with surfaces 326 on top of elevated substrate regions 110, 310. Some of the material may also be deposited on the bottom of trenches 120, 320, and to a lesser extent on the sidewalls 350 of trenches 120, 320, unless said trenches are chosen to be very narrow, or have already been narrowed down in a previous epitaxy step. In other words, according to the invention, process sequence 200 may lead to a very different layer structure than can be anticipated from prior art, even for thick epitaxial layers. Instead of coalescing into a continuous film, the layers grown in step 250 may be composed of isolated patches epitaxially grown on elevations 110.

Figure 3B:
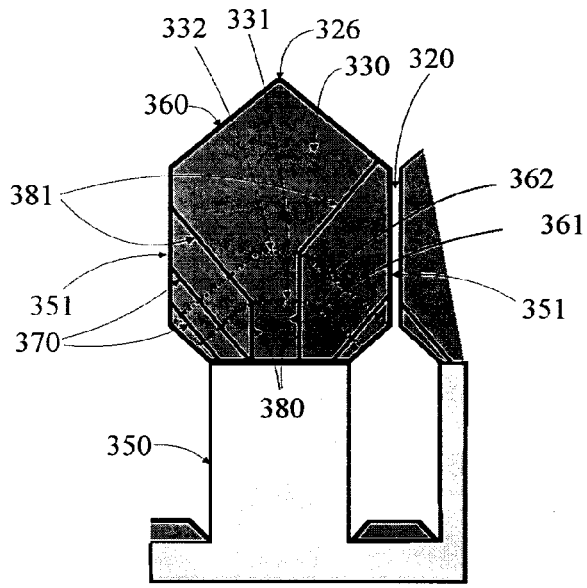

Isolated epitaxial patches 330, evolving into pillars as growth proceeds, may have a profound influence on the dislocation structure, as may be seen from FIG. 3(b). Here, dislocations 370 lying in glide planes inclined to the interfacial plane may reach sidewalls 351 even in the absence of any glide motion, because such glide planes all cut through the sidewalls sooner or later during growth. If surfaces 326 of isolated epitaxial patches 330 have inclined facets 360, 361, 362 during growth, then vertical, sessile dislocation lines 380 may be additionally deflected into dislocation lines 381, extending towards sidewalls 351 by interacting with inclined facets 361, 362, 360. Faceting may be achieved by choosing process conditions during epitaxial growth step 250 such that horizontal top facets 331, 332 shrink during growth, while inclined facets 361, 362 expand. This may require for example a lower deposition rate and higher substrate temperature during epitaxial growth step 250, in order to increase the surface diffusion length, for example favouring the growth of more stable facets. Once a sufficient height of epitaxial pillars has been attained, depending on the width w of substrate patterns 110, all sessile vertical dislocation lines 380 have been successfully deflected into tilted lines 381 extending to sidewalls 351.

Figure 3C:
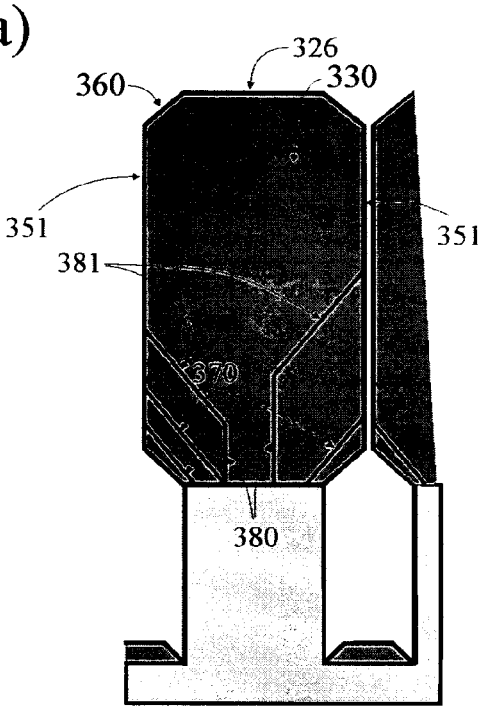

As shown in FIG. 3(c), processing conditions of epitaxial growth step 250 may be changed again at this point, such as to favour horizontal top facets 326 to expand again at the expense of inclined facets 360. All threading dislocations 370, 381 may thus have reached sidewalls 351 by the time inclined facets 360 have been satisfactorily reduced in size in order to facilitate further processing with essentially horizontal top surfaces 360. By swapping process conditions 250 and 260 back and forth between facetted and planar pillar growth, the morphology of the final structure may thus be tuned in a wide range, while forcing all dislocation lines to end at sidewalls 351, where they cannot do any harm.

The growth step 250 may also be followed by an optional annealing step 260, whereupon the dislocation structure of the grown layer may change, for example by means of glissile threading dislocations moving to the edges of regions 110, 351. Steps 250 and 260 may be repeated a number of times, for example in order to increase the thickness of a given semiconductor material, or to form a stack of different materials on top of one another, while choosing conditions such that layer patches 330 remain isolated.

In another aspect of the embodiment, elevated substrate regions 110 may be too large for complete inclined facets 360 to form. Dislocations 380 may still be removed from horizontal flat areas 326 by a suitable choice of epitaxial growth step 250 of process sequence 200. Such a choice may include the well known concept of compositional grading (see for example U.S. Pat. No. 5,221,413 to Brasen et al., the entire disclosure of which is hereby incorporated by reference). For shallow grading rates a growing graded layer on top of a mismatched substrate corresponds to a system of low effective lattice mismatch, and vertical dislocations 360 are not expected to form. On the other hand, dislocation glide to the sidewalls of epitaxial patches 330 is expected to happen very efficiently, as long as the dimensions of elevated substrate regions 110, 310 are chosen to be no larger than about 10 µm (see for example Hammond et al., Applied Physics Letters 71, 2517 (1997), the entire disclosure of which is hereby incorporated by reference). While the grading rate has to be kept low for continuous graded layers, for example 10%/µm, in order to facilitate dislocation glide, this is no longer necessary for structures of micron size or even smaller. According to the invention, the grading rate can thus be increased to as much as 100%/µm, or even 200%/µm, depending on the size of elevated substrate regions 110, 310. Isolated epitaxial patches 330 can therefore be chosen to be thin, with heights 312 for example as low as 0.5 µm, even when said patches incorporate a graded layer.

The optional use of compositional grading may be used for any material system forming miscible alloys in a non-negligible concentration range. Such examples may be SiGe, InGaAs, HgCdTe, PbTeSe, InGaN, and any others suitable for electrical, electro-optical and further applications.

After completion of the final layer stack, the substrate may be cooled, and removed from the epitaxy reactor in step 270. Depending on the application, device fabrication steps 280 may follow, in general consisting again of many sub-steps known to those working in the field. It is understood that many variations of process sequence 200 may be applied, including repetitions of the whole sequence after completion of step 280, with or without an additional patterning step 210.

For epitaxial growth step 250 any of the methods may be used, which are known to experts working in the field, such as molecular beam epitaxy (MBE), chemical vapour deposition (CVD), metal-organic chemical vapour deposition (MOCVD), or magnetron sputter epitaxy (see for example International patent application number WO9604677 to von Kanel et al., the entire disclosure of which is hereby incorporated by reference), or low-energy plasma-enhanced chemical vapour deposition (LEPECVD) (see for example U.S. Pat. No. 7,115,895 to von Kanel, the entire disclosure of which is hereby incorporated by reference), or low-energy plasma-enhanced vapour phase epitaxy (LEPEVPE) (see for example WO2006097804 to von Känel, the entire disclosure of which is hereby incorporated by reference).

Figure 4:
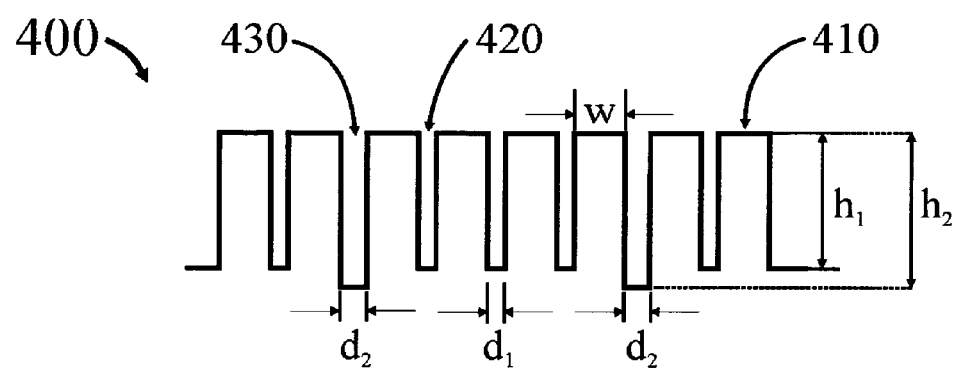
FIG. 4 is a schematic cross-section of a patterned wafer with groups of patterns.
Figure 5:
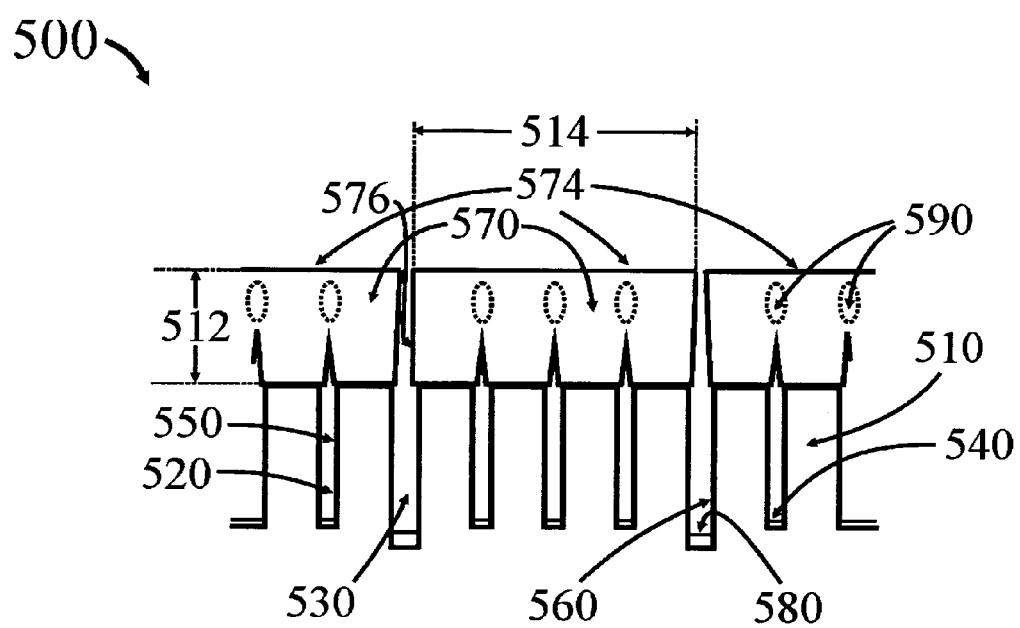
FIG. 5 is a schematic cross-section of a layer grown on a patterned wafer after merging of epitaxial regions.

Referring now to FIG. 4, an aspect of a second embodiment is shown, in which trenches 420, 430, etched into substrate 400 may have unequal widths $d_1$ and $d_2$, where for example $d_2$ is larger than $d_1$. This may be achieved by choosing corresponding feature sizes of the lithographic structures defined during substrate patterning step 210. As is well known to those working in the field, unequal widths of trenches 420, 430 may lead to unequal depths $h_1$ and $h_2$ during a reactive ion etching or chemical etching step. As may be seen in FIG. 5, elevated substrate features 410, 510, may therefore give rise to epitaxial regions consisting of merged structures 570 with sidewalls 576 above narrow trenches 420, 520, while wider trenches 430, 530 remain open. On the bottom 540 of narrow trenches 420, 520 less or negligible material may be deposited during epitaxial growth step 250 and optional annealing step 260 than on the bottom 580 of wider trenches 430, 530. Likewise, the side walls 550 of narrow trenches may receive less or negligible material during epitaxial growth step 250 and optional annealing step 260 than the side walls 560 of wider trenches 430, 530.

Merged structures 570 may be formed above narrow trenches 420, 520 by choosing conditions during epitaxial growth steps 250 and optional annealing steps 260, well known to experts working in the field, such as reducing deposition rates and increasing substrate temperatures, causing an increase of surface diffusion lengths, in order to reduce the ratio between vertical and lateral growth velocities. The size 514 of epitaxial structures 570 may be chosen arbitrarily by choosing the spacing between wider trenches 430, 530. It is, however, advisable to choose this size in accordance with the mismatch of thermal expansion coefficients and thickness 512 of the deposits, in order to avoid layer cracking and wafer bowing during cooling to room temperature or during any thermal cycle.

In one aspect of the embodiment processing steps 250, 260, of processing sequence 200 may be chosen in such a way as to favour voids 590 to form, in merged structures 570, above narrow trenches 420, 520. The presence of voids 590 may be a way of relieving thermal stress in merged structures 570 or a means to lower dislocation densities during island merging.

It is understood that in other aspects of the embodiment, more than two different trench widths and more than one spacing between wider or narrow trenches may be chosen, as well as many different shapes and sizes of elevated substrate regions.

Figure 6:
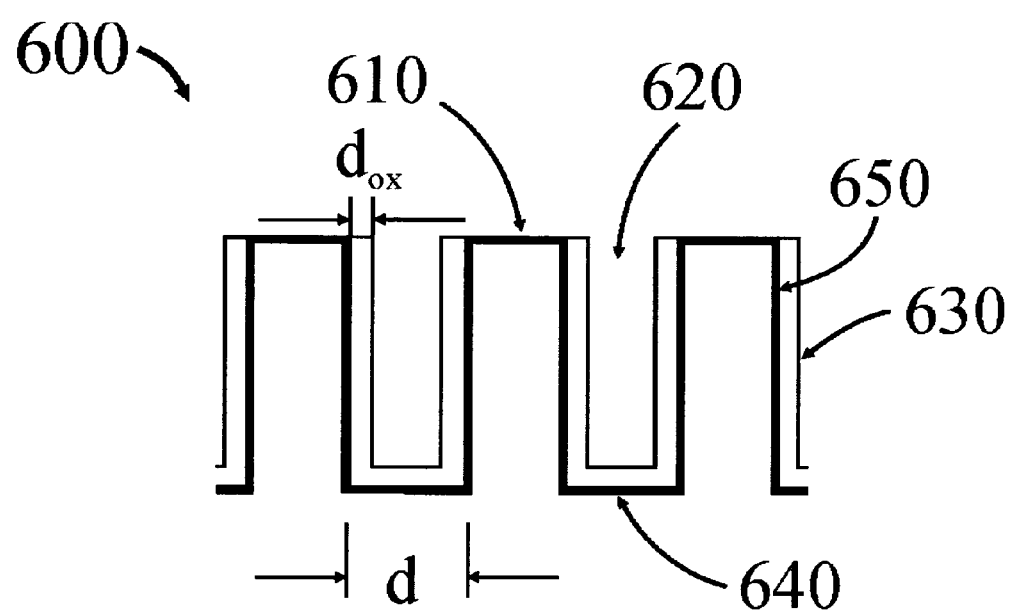
FIG. 6 is a schematic cross-section of a patterned wafer with oxidized bottoms and side walls.

Referring now to FIG. 6, a third embodiment with substrate pattern 600 is shown, in which sidewalls 350, 550, 560, 650 and bottoms 340, 540, 580, 640 of trenches 120, 320, 420, 430, 520, 530, 620 are coated with dielectric layer 630. On elevated regions 110, 410, 610 the clean substrate is exposed as before. This may be achieved by processes well known to experts working in the field. The patterned substrate may for example be coated with dielectric layer 630. Subsequently, this dielectric layer may be removed from elevated regions 110, 410, 610 for example by protecting bottoms 340, 540, 580, 640 and side walls 350, 550, 560, 650 of trenches 120, 320, 420, 430, 520, 530, 620 with a protective layer while it is being etched. Dielectric layer 630 may for example be a thermal oxide formed on a patterned Si substrate. Layer 630 may be advantageously used by choosing a selective epitaxy process in epitaxial growth step 250. Side walls 350, 550, 560, 650 may thus be prevented from being covered independent of the widths of trenches 120, 320, 420, 430, 520, 530, 620 by using a selective epitaxy process in growth step 250.

It is understood that simple substrate pattern 600 is but an example of arbitrarily different substrate patterns that may be used. Moreover, substrate pattern 600 with coated side walls and bottoms of trenches 120, 320, 420, 430, 520, 530, 620 may be combined with patterned substrate regions wherein dielectric coatings 630 have not been applied.

Figure 7A:
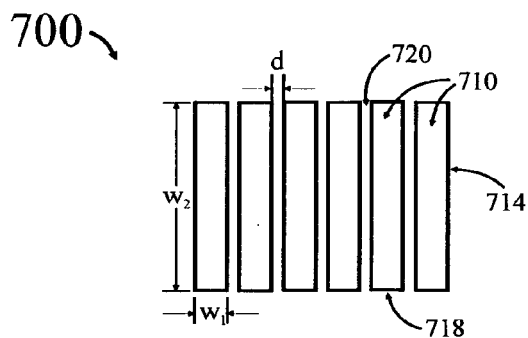
FIG. 7(a) to FIG. 7(e) are schematic top views and cross-sections of patterned wafers with variations of patterns.

Referring now to FIGS. 7a to 7d, various embodiments are shown, exhibiting examples of variations of substrate patterns. It should be understood by any expert working in the field that there may be many more possible patterns, giving rise to dislocation-free and crack-free epitaxial regions after execution of steps 250, 260 of processing sequence 200. In FIG. 7a, elevated substrate regions 710 are rectangular in shape. Long sides 714 of the rectangles may be oriented along a symmetry direction of the substrate, for example along <110> or <100> for a cubic substrate with surface normal <001>. The <100> orientation may favour dislocation glide, or simply dislocation line extension during growth, to the edges of isolated patches 330 during execution of steps 250, 260 of processing sequence 200.

It is advisable to keep the aspect ratio $h/w_1$ between the depth h of trenches 720 and the short side 718 of rectangular elevated regions 710 larger than one, in preferred aspects of the embodiments much larger than one, such as for example ten. This may enhance the elastic contribution of misfit stress relaxation along the direction of short sides 718, during execution of steps 250, 260 of processing sequence 200.

Figure 7B:
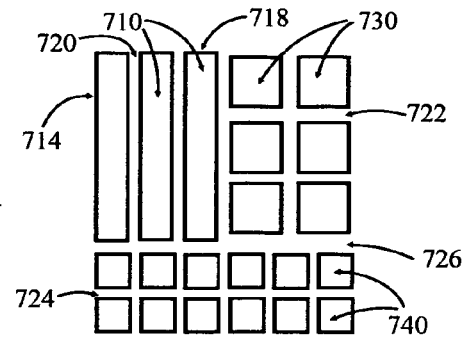

Referring now to FIG. 7b, a substrate pattern is shown, where elevated regions 710, 730, 740 have different sizes and shapes. The width of trenches 720, 722, 724, 726 may be chosen such that after execution of steps 250, 260 of processing sequence 200, epitaxial layers formed on elevated substrate regions 710, 730, 740 do not form a continuous film.

Figure 7C:
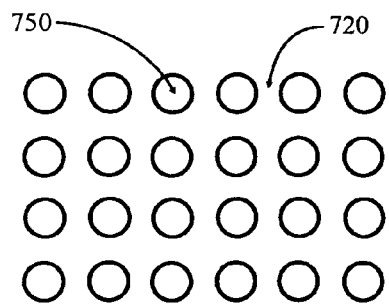

Referring now to FIG. 7c, it may be seen that elevated substrate regions 750 to not need do have square shapes. By way of example, regions 750 are shown to be circular in shape. Many more shapes are possible, as long as trenches 720 are designed such that after execution of steps 250, 260 of processing sequence 200 epitaxial layers formed on elevated substrate regions 750 do not form a continuous film.

Figure 7D:
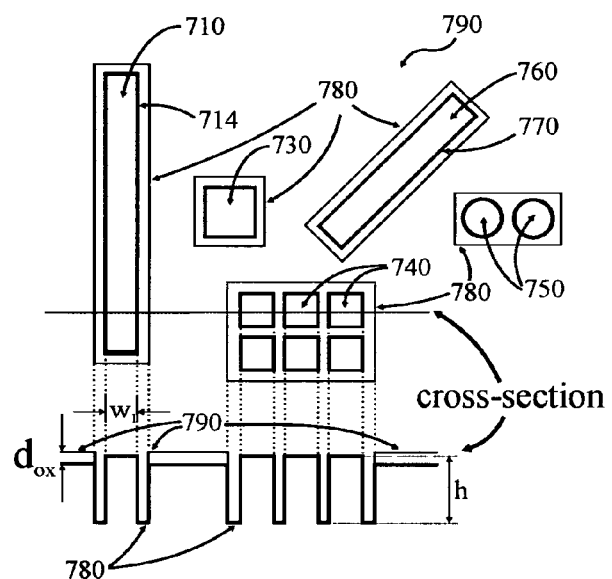

Referring now to FIG. 7d, an embodiment is shown in which elevated substrate regions 710, 730, 740, 750, 760, are spaced too far apart to prevent layers deposited in between from cracking. Regions outside of trenches 780 surrounding substrate regions 710, 730, 740, 750, 760, may therefore be coated with a dielectric layer 790. Likewise, bottoms and side walls of trenches 780 may be coated with a dielectric layer. The dielectric coatings 790 may for example be a thermal oxide formed on a patterned Si substrate. Semiconductor material may be prevented from growing on dielectric regions 790 if a selective epitaxy process is used in step 250 of processing sequence 200.

Figure 7E:
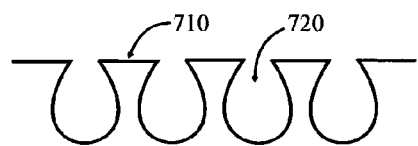

Referring now to FIG. 7e, it may be seen that the substrate patterning need not lead to straight side walls of trenches 120, 320, 420, 430, 520, 530, 620, 720, 722, 724, 726, 780. In fact, the formation of under-etched trenches may be very advantageous for several reasons. First of all, under-etching reduces the width of substrate posts beneath elevated regions 710, compared to equally sized regions 710, defined by vertical side walls. Elastic relaxation of the substrate may therefore be enhanced, and thus the density of misfit dislocations lowered to some extent. Second, side wall coverage may be greatly diminished or even eliminated altogether for sufficient under-etching, even when trenches are not chosen to be very narrow, and even in the absence of dielectric layer 630 and in the absence of selective area epitaxy during epitaxial growth step 250. This may be advantageous for all applications in which the electrical properties of elevated substrate features 110, 310, 410, 510, 610, 710, 730, 740, 750, 760, are altered by the deposition of material on the side walls during execution of steps 250, 260 of processing sequence 200.

It is understood that FIGS. 7a to 7e are only examples of substrate patterns according to the invention. Substrate patterns may be combinations of these patterns, or any patterns of different shape and symmetry, for example face-centered square or hexagonal symmetry, as long as they contain elevated regions 110, 310, 410, 510, 610, 710, 730, 740, 750, 760 separated by trenches suitable for the epitaxial growth of isolated patches on top.

EXAMPLES

Substrate Patterning

Figure 8A:
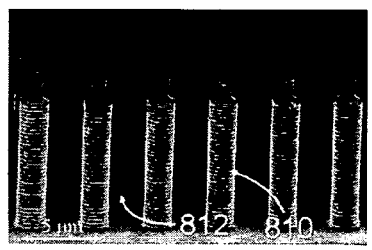
FIG. 8(a) to FIG. 8(c) are SEM images of a patterned Si wafers in perspective view (a) and in plan view (b), (c).
Figure 8B:
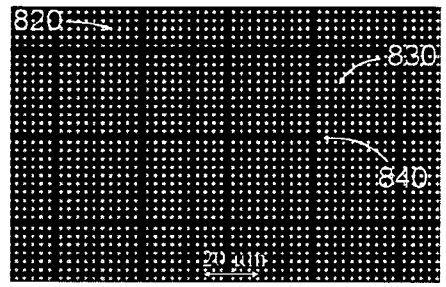
Figure 8C:
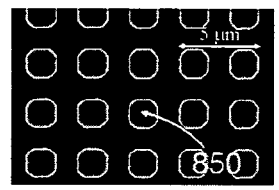
Figure 8C:
Figure 8C:
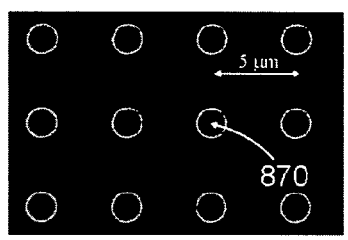
Figure 8C:
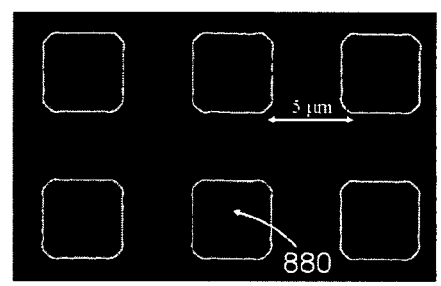

Referring now to FIGS. 8(a)-8(c), scanning electron microscopy (SEM) images 800 of patterned substrates may be seen in perspective (a) and plan (b)-(c) view. Here, the substrate is a Si(001) wafer which was patterned by standard photolithography and the Bosch process, leading to the ripples on the side walls of Si pillars 810. In FIG. 8(a) pillars 810 are about 1.8 µm wide, while the width of trenches 812 is about 2.2 µm. The plan view SEM image of FIG. 8(b) shows two different kinds of trenches with widths of about 1.7 µm for narrow trenches 830 and 2.9 µm for wider trenches 840, while pillars 820 are about 1.3 µm wide. Wider trenches 840 are about 8 µm deep, and narrow trenches 830 slightly less.

FIG. 8(c) shows other examples of patterns, A1, B1, C1 and D2, composed of elevated substrate regions 850, 860, 870 and 880 of different size and distance. Many more substrate patterns have been examined with elevated features ranging from submicron to tens of microns in size, and with trench width variations in a similar range.

Figure 9A:
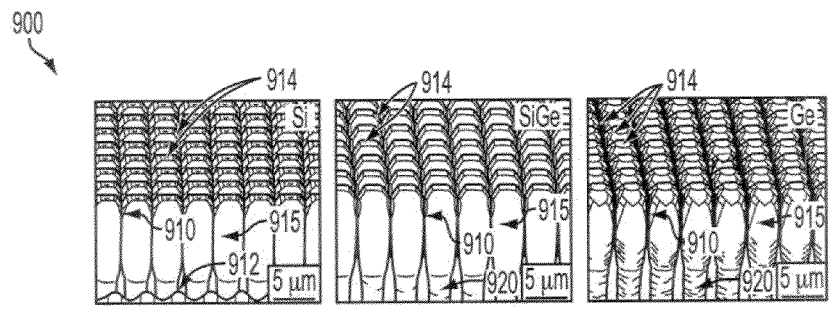
FIG. 9(a) to FIG. 9(b) are perspective views of SEM images of different epitaxial structures grown by LEPECVD on patterned Si substrates.

Epitaxy on Patterned Substrates (1) Isolated Features: Examples of Islands and Ridges Referring now to FIGS. 9(a) to 9(e), SEM images patterned Si(001) substrates 900 are shown, on which various epitaxial layers were grown by using steps 250 and 260 of processing sequence 200. FIG. 9(a) are perspective views of pure Si, $Si_{0.6}Ge_{0.4}$ alloy, and pure Ge pillars 915 grown to a height of about 8 µm. As is well known to researchers working in the field of Ge/Si heteroepitaxy, the lattice mismatch between pure Si and Ge is about 4.2% at room temperature. The mismatch of thermal expansion coefficients is even larger, amounting to about 125% at room temperature. Apart from being characterized by a high density of TDDs, continuous Ge layers beyond a thickness of a few micrometers are therefore bound to crack, and to induce significant layer bowing.

The image of FIG. 9(a) shows, however, that neighbouring Si, SiGe and Ge regions 915 grown onto Si pillars do not touch, when processing conditions 250 and widths of trenches 812, 830, 840, are chosen such as to favour vertical with respect to lateral growth. By contrast, processing conditions 250 have been chosen by taking into account the different surface diffusion lengths for Si, SiGe, and Ge, at given substrate temperature and deposition rate. In this way, spacings 910 between adjacent pillars 915 are nearly the same for all three materials. According to the figure, there is little under-etching of the Si pillars in this example. A small amount of side-wall deposition 920 can therefore be seen in addition to some deposition at the bottom 912 of the Si trenches, occurring mostly at the beginning of the growth.

Figure 9B:
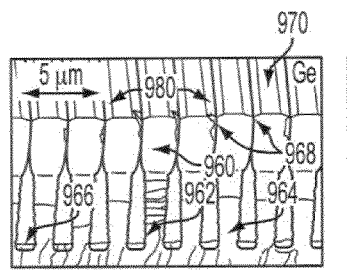

FIG. 9(b) is a perspective SEM view of a cleaved cross-section through Ge ridges 960 oriented along the <1-10> direction of the substrate. Conditions of process step 250 have again been chosen in such a way that neighbouring ridges 960 remained separated by narrow trenches 968. A small amount of sidewall deposition 962 can again be seen, in addition to some deposition at the bottom 966 of the Si trenches, occurring mostly at the beginning of the growth. Note that the horizontal top facet 970 of the Ge ridges is a (001) facet, while inclined facets 980 are {113} facets.

Figure 9C:
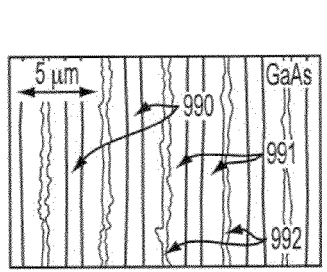
FIG. 9(c) is a top view of epitaxial structures grown by MBE on patterned Si substrates.

According to high-resolution X-ray diffraction measurements (see also FIG. 14), the pillars and ridges shown in FIGS. 9(a) and (b) are fully relaxed. For example the pure Ge structures can therefore be used as templates for the growth of GaAs. FIG. 9(c) shows an example in which GaAs has been grown onto Ge ridges similar to the ones in FIG. 9(b). Similar to the Ge itself, the GaAs ridges are facetted, with (001) facets 990 on top and inclined facets 991. Note that the surface diffusion lengths have not been optimized in the example shown, such that trenches 992 have nearly closed.

Figure 9D:
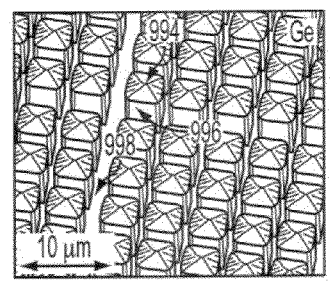
FIG. 9(d) is a perspective view of SEM images of epitaxial structures grown by selective CVD on patterned Si substrates.

FIG. 9(d) shows an example of a patterned Si(001) substrate, where sidewalls 650, 810, 830, 840 have been oxidized before selective Ge growth. As a result, Ge deposition 994 has occurred only on top of Si pillars, while no material has nucleated on sidewalls 996 and bottoms 998 of trenches.

Figure 9E:
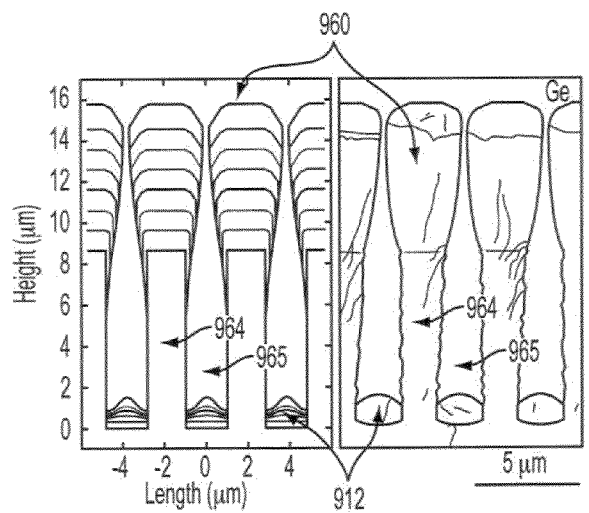
FIG. 9(e) is a cross sectional view of epitaxial structures grown on patterned Si substrates with corresponding simulation.

FIG. 9(e) finally shows a simulation and corresponding SEM image of a cross-section through Ge ridges 960. In this case Si ridges 964 and trenches 965 are about 2 μm wide and 8 μm high. According to the simulations, the self-aligned vertical growth visible in FIGS. 9(a), (b) and (e) is quite general and results from a combination of two main factors. The first factor is a kinetic one, concerning the short diffusion length along the surface of epitaxial structures 915, 960 (some 100-200 nanometers, in any case smaller than typical facet sizes), preventing transfer of the deposited material from one facet to another, at least within the prototypical times for crystalline incorporation. In this framework, the facets grow nearly independently, at a rate determined by the incoming flux and the velocity for crystalline incorporation. The second factor is one related to the peculiar kind of patterning, i.e. the mutual geometric shielding of the incoming flux by the elevated substrate regions, whereby reactant supply to sidewalls of pillars 915 and ridges 960 and to bottoms 912, 966 of trenches is greatly reduced (from 50% to about 0.1%) with respect to the reactant supply available to top facets 914, 970, 980, 990. The sidewalls of pillars 915 and ridges 960, receiving a progressively smaller flux when coming close to one another, eventually stop growing laterally, expanding almost exclusively vertically instead, as is well known to the experts working in the field. According to the simulation, the predominance of vertical over lateral growth visible in FIG. 9 requires a careful balance of deposition rates and substrate temperatures in steps 250, 260 of process sequence 200, thereby ensuring that the surface diffusion length becomes sufficiently small. This may be achieved for example by using high deposition rates in a plasma-enhanced CVD process such as LEPECVD. The experimental results of FIGS. 9(a), (b) and (e) have been obtained by such a process, at growth rates of about 4 nm/s. Alternatively, in a thermal CVD process, preferably precursors decomposing at low substrate temperatures should be used, in order to guarantee low diffusion lengths at comparatively low deposition rates. The selective Ge deposition shown in FIG. 9(d) has been achieved in such a way, with germane decomposition occurring already at substrate temperatures below 500° C. The growth was performed in a two-step process, wherein a thin template is first formed at 330° C. at a very small rate of about 4 nm/min, followed by the main deposition at 500° C., at a rate of 25 nm/min. For the growth of compound semiconductors, an additional degree of freedom comes into play, since surface diffusion constants depend also on the ratio between anion and cation supply. The example of GaAs shown in FIG. 9(c) has been obtained by solid source MBE at a substrate temperature of 520° C., with arsenic supplied from a cracker cell, and gallium in the usual elemental form. In this case the deposition rate was chosen to be very small, of the order of 0.1 nm/s, and the surface diffusion length was kept small by choosing a low III/V ratio of about 1:20.

Experiments and simulations hence both show that growth of isolated epitaxial structures on top of elevated substrate regions 110, 310, 410, 510, 610, 710, 730, 740, 750, 760 may be achieved by many different deposition processes by careful choice of steps 250, 260 of process sequence 200.

Figure 10A:
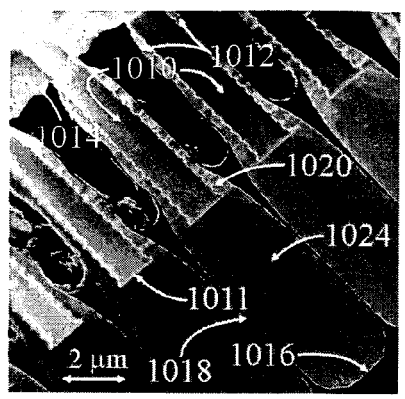
FIG. 10(a) to FIG. 10(b) are dark field STEM images of cross-sections through an 8 μm thick Ge epilayer on a patterned Si substrate.
Figure 10B:
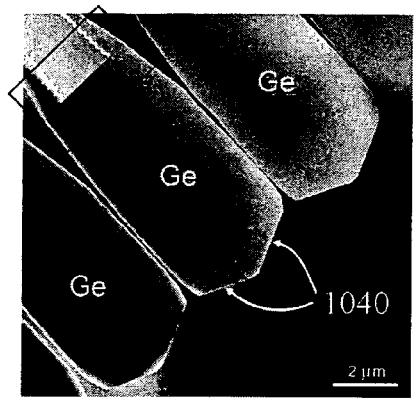
Figure 10B:
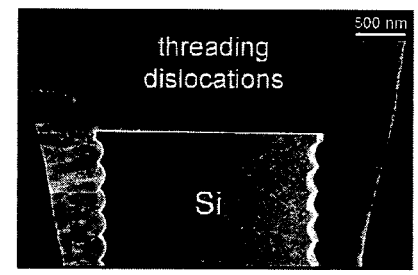
Figure 10C:
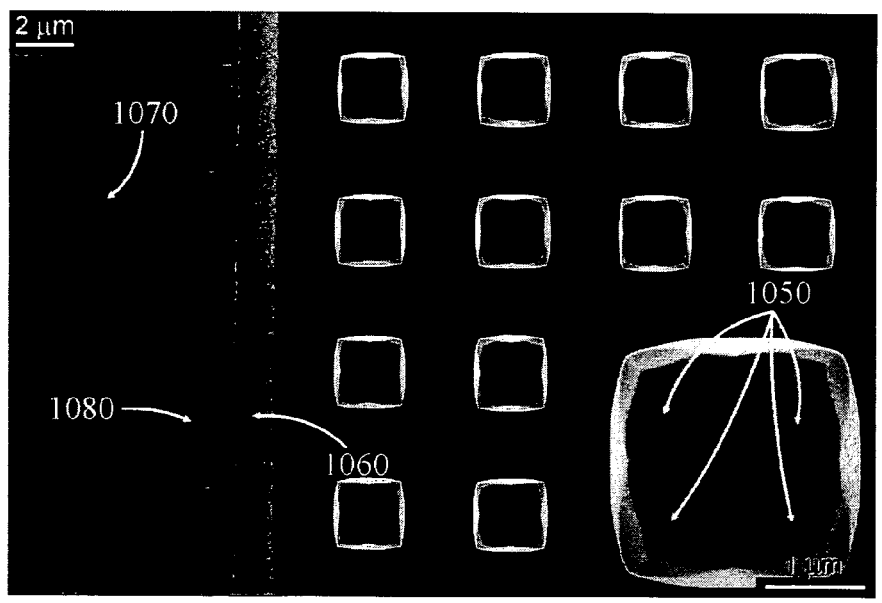
FIG. 10(c) is a plan view of the boundary between patterned and unpatterned regions of a Ge epilayer after defect etching.

Referring now to FIGS. 10(a) to 10(c), the results 1000 of a defect analysis of Ge grown onto a patterned Si(001) substrate may be seen. FIGS. 10(a) and (b) are dark field scanning transmission electron microscopy (STEM) images obtained on cross-sections through Ge pillars characterized by different facet structures. Top facet 1016 in FIG. 10(a) is a (001) facet parallel to the surface 1011 of Si pillars 1010. Conditions of step 250 of process sequence 200 have again been chosen such as to ensure finite gaps 1018 between individual Ge pillars. Because of vertical sidewalls of elevated substrate features 1010 and use of non-selective growth, finite coverage has occurred on sidewalls 1012 and bottoms 1014 of the Si trenches. FIG. 10(a) shows that threading dislocations 1020 are confined mostly to deposits on sidewalls 1012 and to the vicinity of the tops 1011 of Si pillars 1010. In fact, most TDDs move to the edges of the Ge islands within a distance of about one micron from the Ge/Si(001) interface.

One straight dislocation 1024 running up to the top of the Ge pillar can, however, be seen. This dislocation is not deflected because it forms a right angle with respect to surface facet 1016. No dislocations extending to the top of Ge pillars with inclined facets 1040 shown in FIG. 10(b) have ever been seen.

As is well known by experts working in the field, cross-section TEM analyses are not, however, suitable for a quantitative analysis of dislocation densities. The TEM studies of mismatched layers grown on patterned substrate surfaces were therefore complemented by defect etching and etch pit counting. FIG. 10(c) shows an SEM image the boundary between a patterned and a flat substrate region 1070 onto which a Ge layer has been epitaxially grown in a manner similar to that of FIG. 10(b), i.e., for conditions leading to fully facetted pillar growth. The SEM image was taken after a standard defect etching procedure. The image reveals etch pits 1080 exclusively in the un-patterned substrate region, but none in inclined facets 1050 on top of pillars and 1060 at the boundary. We may therefore conclude that the mechanism of dislocation deflection by surface facets, as depicted in FIG. 3(b), is very effective for structures with sufficiently large aspect ratios.

(2) Merged Ge Pillars

Figure 11A:
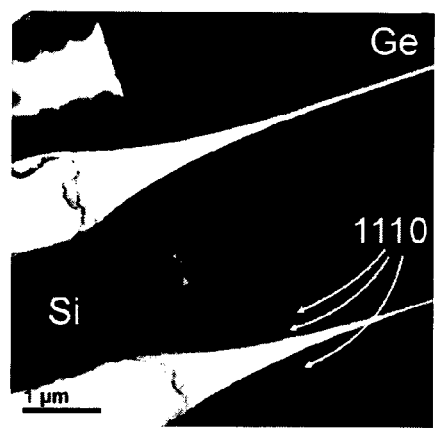
FIG. 11(a) is a bright field cross-section TEM image of a 8 μm thick Ge epilayer on patterned Si substrate, the epilayer consisting of individual pillars
Figure 11B:
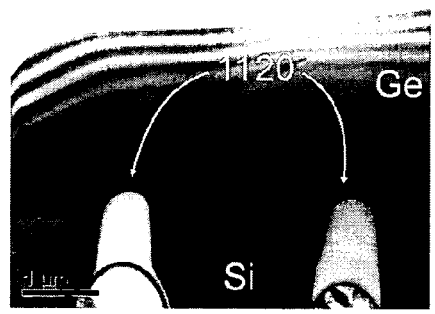
FIG. 11(b) is a bright field cross-section TEM image of a 8 μm thick Ge epilayer on patterned Si substrate, the epilayer consisting of regions with fused pillars.

Referring now to FIGS. 11(a) to 11(b), a comparison of the defect structure of free-standing and merged Ge pillars 1100 on patterned Si(001) may be seen. FIGS. 11(a) and (b) are bright field TEM images of cross-sections taken through free-standing Ge pillars (a) and merged pillars (b). In FIG. 11(a) dislocations 1110 can be seen, which have been deflected by interacting with inclined facets during pillar growth. Dislocations 1110 are again confined to a region close to the top of the substrate pillars. Interestingly, no additional dislocations seem to have formed upon pillar merging, as revealed by regions 1120 of FIG. 11(b), located in the gap between Si pillars, where the Ge growth fronts must have met each other during the process of pillar fusion.

Figure 12A:
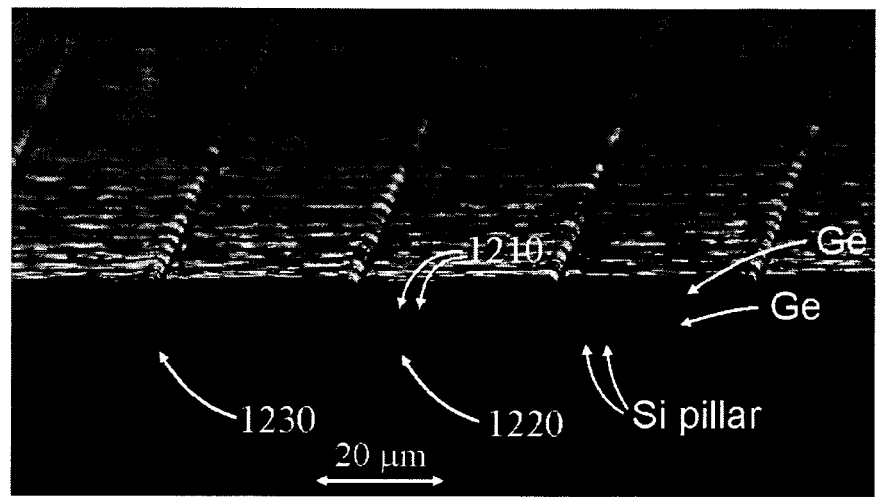
FIG. 12(a) is a perspective view SEM image of a Ge layer grown on a patterned Si substrate showing regions of merged Ge-pillars.
Figure 12B:
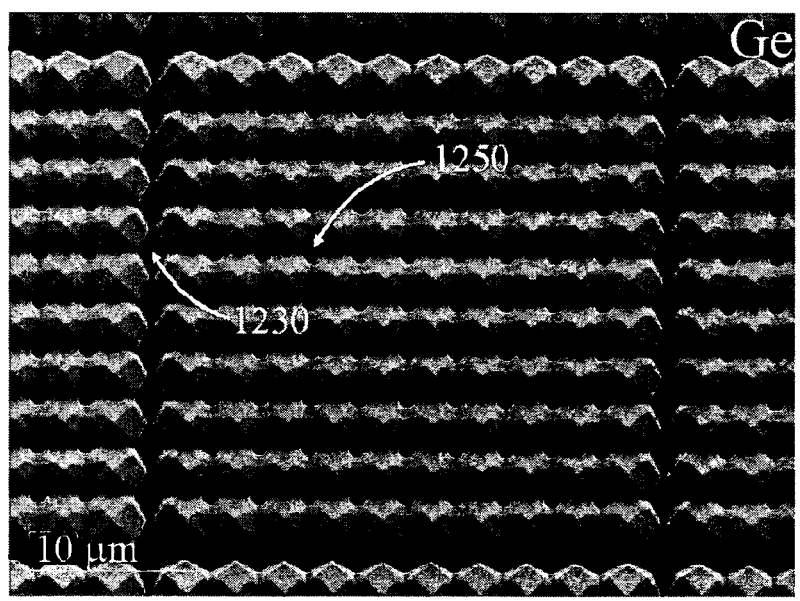
FIG. 12(b) is a plan view SEM image of a Ge layer grown on a patterned Si substrate showing regions of merged Ge-pillars.

Referring now to FIGS. 12(a) to 12(b), the marginal generation of dislocations during pillar merging is shown via images 1200, allowing the reason therefor to be deduced. FIG. 12 (a) is an SEM image in perspective view of an epitaxial Ge layer grown on a patterned Si(001) substrate to a thickness of about 8 µm. Substrate patterning in this case has been similar to the example displayed in FIG. 8(b), consisting of 10×10 blocks of closely spaced pillars 820, spaced by wider trenches 840. According to FIG. 12(a), the blocks of closely spaced pillars separated by narrow trenches 1220 have merged, while wider trenches 1230 have remained open. A plan view SEM image of a similar structure may be seen in FIG. 12(b). By tuning substrate temperatures during steps 250 and 260 of process sequence, whereby the surface diffusion length may be modified, it has in fact been possible to cause openings 1210, 1250 between the merged pillars. Despite the fusion of selected pillars, separated by trenches of appropriate width, it may therefore be possible to create surface openings at well-defined locations, where dislocations may escape as in the case of isolated pillars.

According to this example, and in accordance with the second embodiment outlined above, the size of contiguous epitaxial regions may be chosen by defining the width of trenches 420, 430, 830, 840, the spacing of wider trenches 430, 840, and by choosing appropriate conditions during execution of steps 250, 260 of processing sequence 200, in order to reduce the vertical with respect to the horizontal growth rate. The squares of merged pillars of FIG. 12(b) are approximately 30 µm long, and consist each of 100 fused Ge pillars. Voids 1210 formed above narrow trenches 1220, may also help in relieving thermal stress, as outlined in the second embodiment above.

(3) Very Thick Structures, Absence of Cracks

Referring now to FIGS. 13(a) to 13(c), SEM images 1300 are shown. From the SEM image of FIG. 13(a), an example may be seen, where Ge islands, grown onto a Si(001) substrate patterned in the form of pillars, are about 25 µm tall. Conditions during steps 250, 260 of processing sequence 200 have been chosen such as to leave a tiny gap 1310 between neighbouring Ge islands, thus avoiding their merging. The SEM image of FIG. 13(b) shows an example of Ge ridges 1330, about 30 µm tall, grown onto ridges 1320 etched into a Si(001) substrate and oriented along a <110> direction. Gaps 1310, 1340 can be tuned to very narrow values, for example as narrow as 50 nm, when steps 250, 260 of processing sequence 200 ensure a sufficiently short surface diffusion length, and a large ratio of vertical to lateral growth velocities.

The Ge islands of FIG. 13(a) are again entirely stress-free, as revealed by HRXRD. By contrast, thermal stress does develop during cool-down from the growth temperature in areas 1350 outside patterned region 1370 visible in the plan view SEM image of FIG. 13(b). As a result, un-patterned regions 1350 tend to form cracks 1360, whereas no cracks form in patterned regions 1370. Furthermore, crack propagation is seen to be inhibited by patterned regions 1370.

According to the invention it may hence be possible to combine lattice and thermally mismatched semiconductor structures of almost arbitrary thickness by growth on suitable substrate patterns 100, 400, 600, 700, as long as steps 250 and 260 of process sequence 200 are chosen such as to prevent large contiguous regions to form.

(4) Comparison with Perfect Substrate Material

Figure 14A:
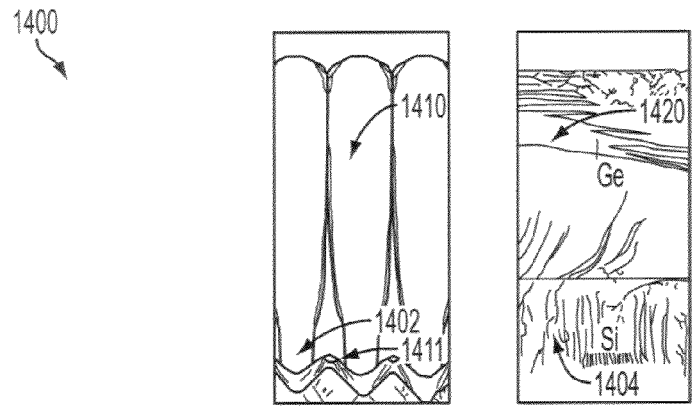
FIG. 14(a) is a SEM cross-section image of a 30 μm thick Ge epilayer on a patterned and unpatterned Si substrate

Referring now to FIGS. 14(a) to 14(d), a comparison of X-ray data 1400 obtained on Ge pillars 1410 grown on patterned Si(001) substrates, continuous Ge layers 1420 grown on un-patterned Si(001) substrates, and finally Ge(001) wafer 1426 may be seen. FIG. 14(a) shows SEM images of 30 µm high Ge pillars 1410 and continuous, 8 µm thick Ge layer 1420, respectively.

In FIG. 13(b) are depicted X-ray reciprocal space maps (RSMs) around the symmetrical (004) reflections from the Si substrate 1402, 1404, and the corresponding (004) reflections from Ge pillars 1410 and layer 1420. Enlarged images of the RSMs in the region of the Ge (004) reflections 1410, 1420 are shown in FIG. 14(d).

Figures 14B, 14C:
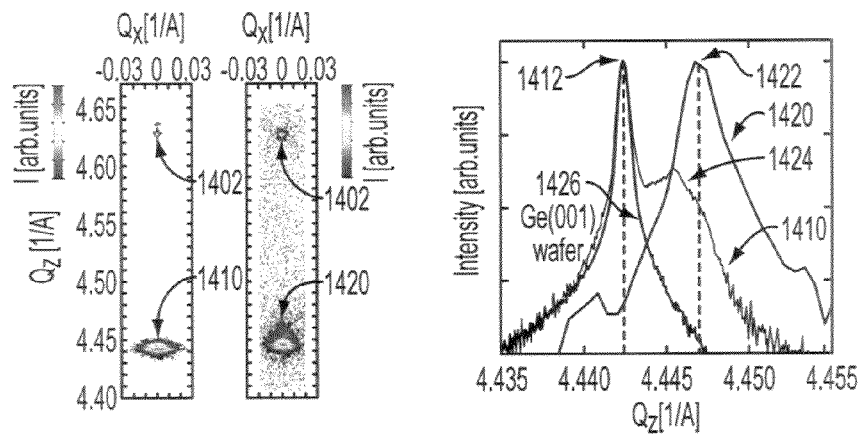
FIG. 14(b) is a corresponding X-ray reciprocal space map of the Ge epilayers of FIG. 14(a) around the Si(004) and Ge(004) reflections.
FIG. 14(c) are intensity curves for the symmetrical (004) reflection of the Ge epilayers of FIG. 14(a) and of a Ge wafer.
Figure 14D:
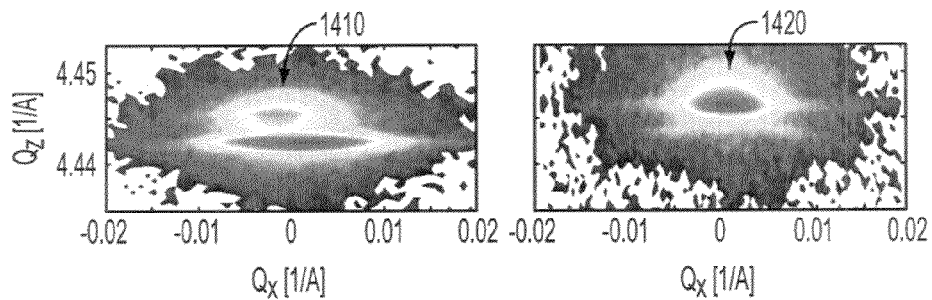
FIG. 14(d) are enlarged views of X-ray reciprocal space maps around the Ge(004) reflections of the Ge epilayers of FIG. 14(a).

FIG. 14(c) shows a comparison of X-ray scans in the region of the Ge(004) reflection along Q. Curve 1410 refers to a measurement obtained on Ge pillars 1410 of FIG. 9(a), curve 1420 to a measurement obtained on continuous Ge layer 1420 of FIG. 9(a), and curve 1426 to the corresponding result obtained on a bulk-Ge wafer. Curve 1410 exhibits sharp peak 1426, whose position and half width are identical to those of perfect Ge wafer 1426, proving that Ge pillars 1410 are completely relaxed and of excellent crystal quality. Curve 1410 has a second maximum at higher $Q_z$ value 1424, stemming from tensile-strained Ge present in trenches 1411. For continuous layer 1420 the maximum occurs at higher $Q_\perp$, from which a tensile strain of about 0.15% can be deduced. It is this thermally induced tensile strain which leads to cracks and wafer bending in the case of thick Ge films.

(5) Compositional Grading and Patterned Growth

Figure 15A:
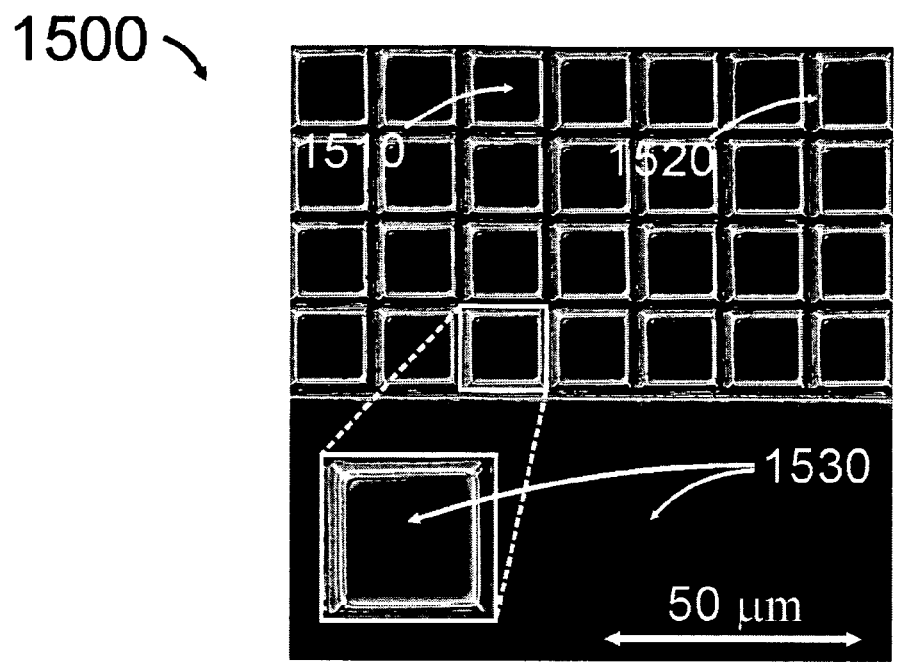
FIG. 15(a) to FIG. 15(b) are Nomarski interference contrast images of a compositionally graded SiGe layer grown on a patterned Si substrate.
Figure 15B:
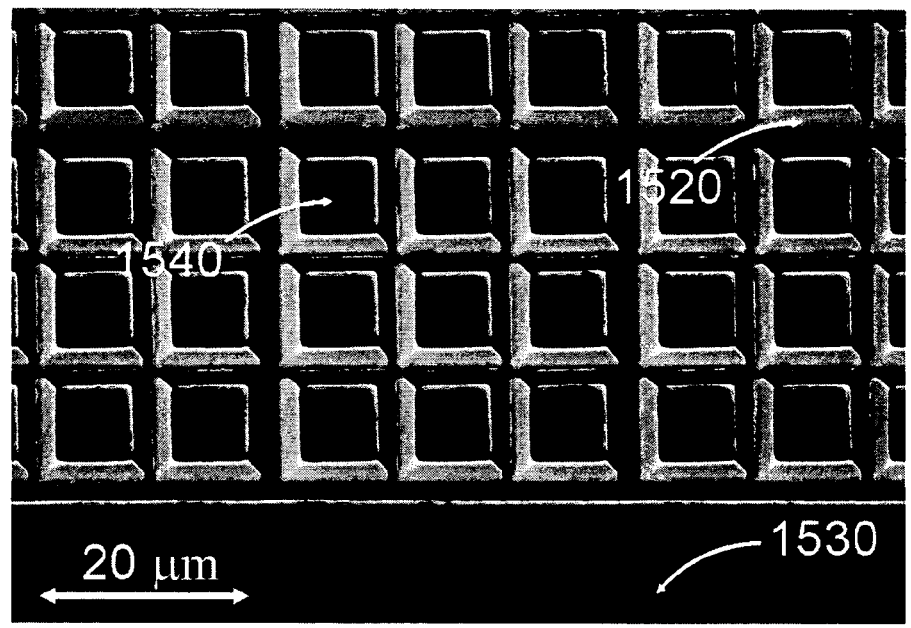

Referring now to FIGS. 15(a) to 15(b), an example may be seen via images 1500 in which epitaxial growth on elevated substrate regions 110, 310, 410, 510, 610, 710, 730, 740, 750, 760 has been combined with the method of compositional grading, wherein a $Si_{1-x}Ge_x$ alloy has been graded from pure Si to pure Ge at a rate of about 10%/µm. FIG. 15(a) shows the boundary between a flat Si(001) substrate region and a patterned region with squares 15×15 µm in size. Isolated epitaxial structures grown on elevated substrate regions of this size are characterized by horizontal facets 1510 bounded by inclined facets 1520. While the surfaces of flat substrate regions exhibit a pronounced cross-hatch, formed by dislocation bunches 1530, very few bunches 1530 may be seen in the patterned part.

According to FIG. 15(b) patterned regions with smaller feature sizes of 9×9 µm do not exhibit any visible cross-hatch on horizontal facets 1540 at all. This indicates effective dislocation glide to the sidewalls of epitaxial patches 330, even when elevated substrate regions 110, 310, 410, 510, 610, 710, 730, 740, 750, 760 are many microns in size. Sessile dislocations 380 are not expected to form in a graded structure, because the effective misfit is always small. When compositional grading is being used, epitaxial patches 330 of sufficient height may therefore remain dislocation-free, even when dislocation deflection cannot occur in the absence of inclined facets 360.

Applications

As mentioned above, a straightforward application of the invention consists of epitaxially growing a semiconductor layer of some material on a patterned substrate of another material, wherein in general the material of the grown layer adds value to the substrate. This may for example happen by choosing a substrate made of cheap metallurgical grade silicon, onto which high purity, highly perfect Si is grown, for example in the pillar form shown in FIG. 9(a). By combining any of the substrate/layer materials considered before, a virtual substrate of an expensive material may be formed. In many cases an obvious choice would be a silicon substrate of preferably large dimensions coated with some expensive semiconductor, such as GaAs or InP. The product of all such applications may hence be a virtual substrate as a starting point for the subsequent fabrication of devices of any kind.

Figure 16:
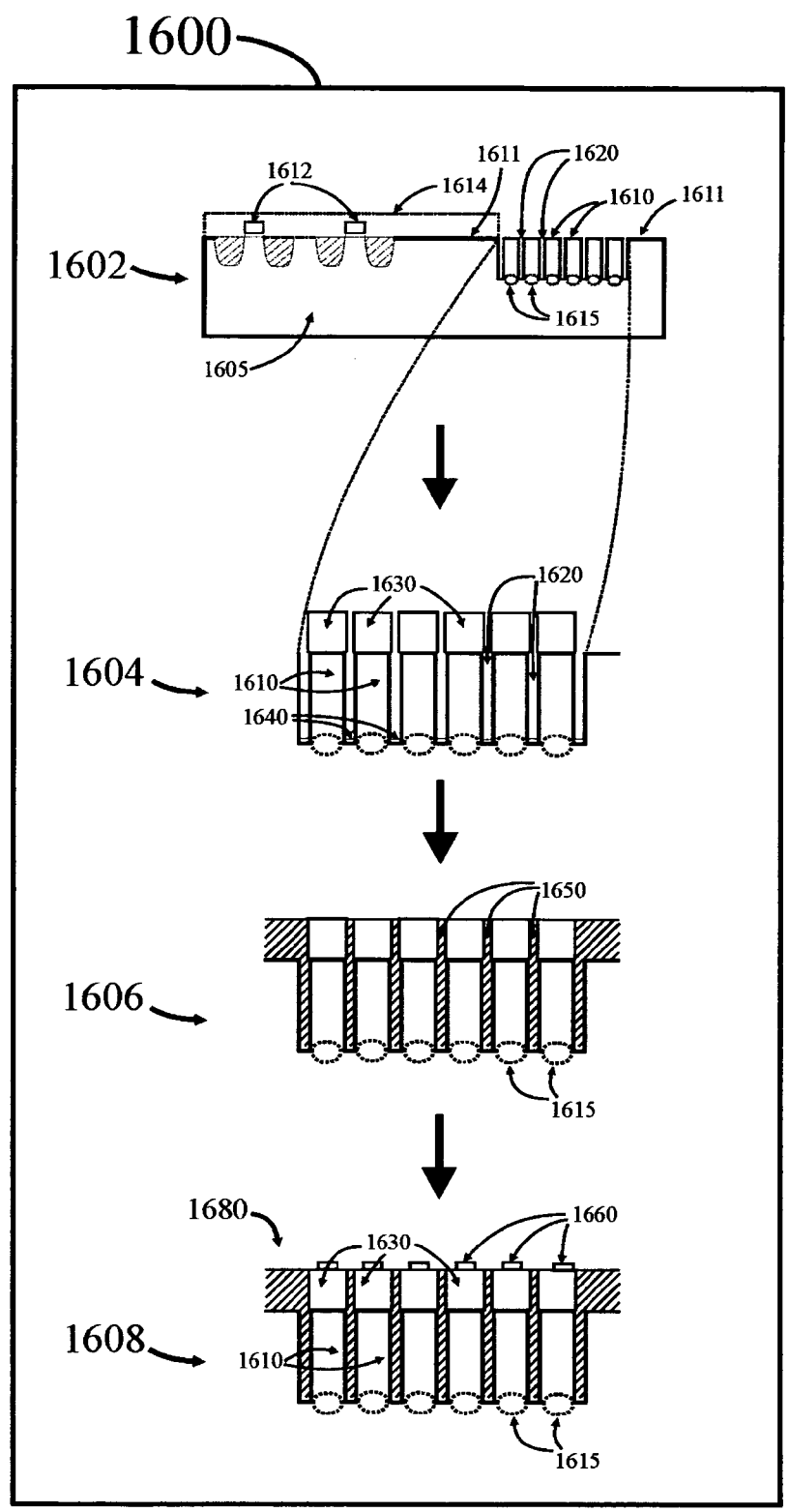
FIG. 16 is a schematic process sequence for device fabrication.

Referring now to FIG. 16, schematic process sequence 1600 for the fabrication of generic device 1680 may be seen. In step 1602 substrate 1605 is patterned according to process step 210 of processing sequence 200, defining at least one elevated substrate region 1610, separated by trenches 1620 from each other and from surrounding areas 1611. Substrate 1605 may for example be a Si wafer or SOI wafer, or a SiC wafer, which may have undergone a number of optional CMOS processing steps, including implantation steps 1615 underneath elevated substrate regions 1610. It may be advisable to protect CMOS circuits 1612 by dielectric layers 1614. Alternatively, substrate 1605 may for example be a Si, SOI, GeOI, SiC, GaAs, InP or sapphire wafer which has optionally been pre-processed in any other way before patterning step 1602.

In process step 1604, steps 220 to 270 of process sequence 200 may be applied, whereby epitaxial layer stacks 1630 are formed on exposed elevated regions 1610 of substrate 1605. In the case that substrate 1605 is a processed CMOS wafer, process step 1604 and all following steps may be chosen to fulfil the requirements for CMOS back end processes. Process step 280 of process sequence 200 may consist of several sub-steps. Sub-step 1606 may consist of filling trenches 1620 with filling material 1650, which may for example be a polymer or an inorganic dielectric. An optional chemical-mechanical polishing step may subsequently be carried in order to create a planar surface before process step 1608. Process step 1608 may include a metallization step in which contacts 1660 are formed on epitaxial layer stacks 1630. Generic device 1680 fabrication may include additional sub-steps, such as for example contacting optional implanted regions 1615.

Depending on the kind of patterned substrates 100, 400, 600, 700, and the kind of epitaxial layer stacks formed in steps 250, 260 of process sequence 200 generic device 1680 may now be applied to encompass photonic circuits consisting of waveguides, modulators, detectors and emitters fabricated from lattice mismatched layer stacks, for example monolithically integrated on a CMOS chip. Generic device 1680 may also encompass electronic circuits fabricated from lattice mismatched layer stacks, for example monolithically integrated on a CMOS chip. Generic device 1680 may also encompass imaging detector arrays, for example monolithically integrated on a CMOS chip, such as infrared imaging detectors and X-ray pixel detectors, where for example every single pixel 1610 may be read out by CMOS circuit 1612. Generic device 1680 may also be an array of multiple-junction solar cells. Generic device 1680 may be any other combination of opto-electronic, microelectronic and photonic devices fabricated from lattice-mismatched layer stacks monolithically integrated on a single-crystal substrate wafer.

Figure 17:
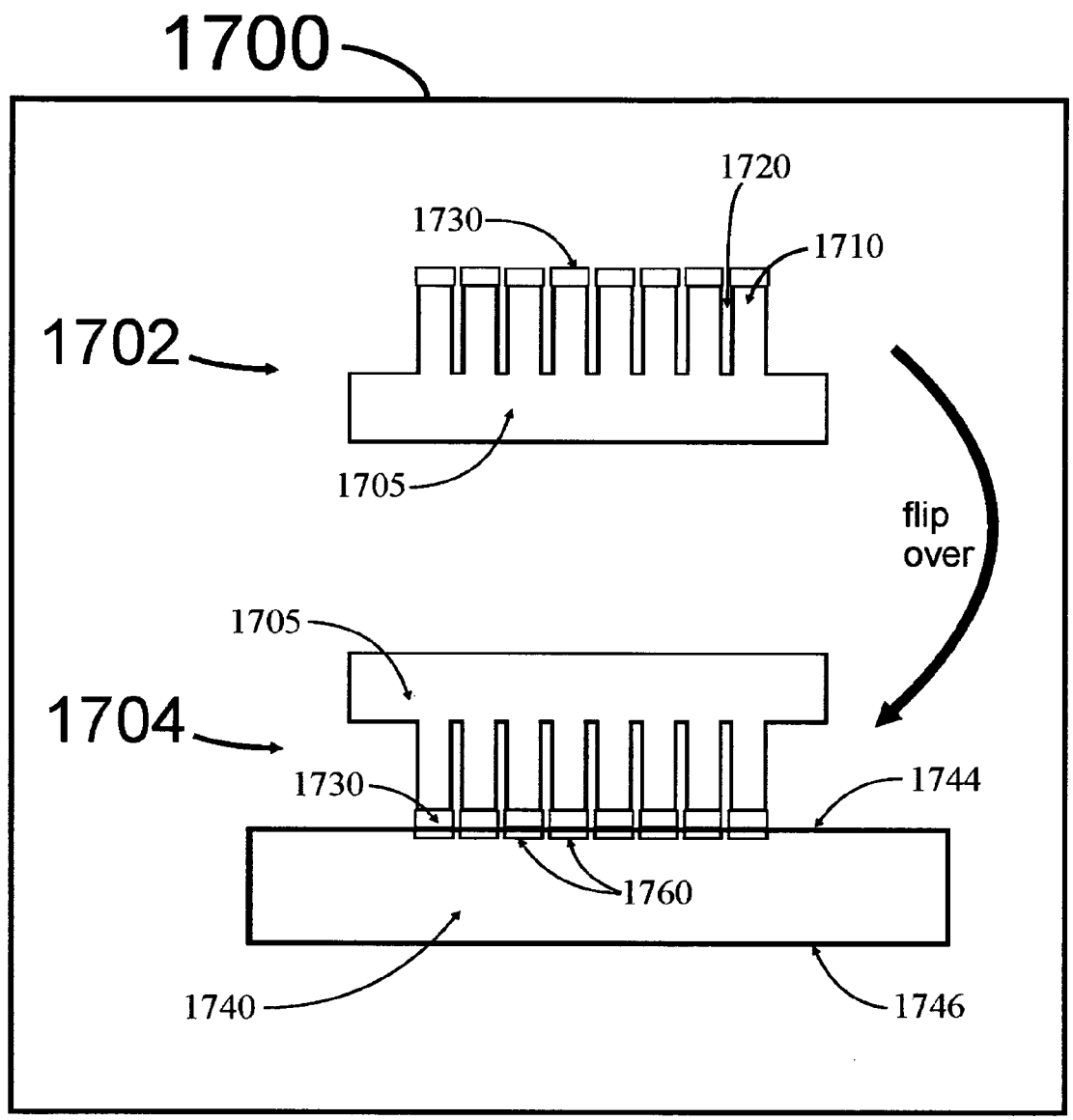
FIG. 17 is a schematic process for device fabrication by wafer flipping and bonding.

Referring now to FIG. 17, a scheme of alternative fabrication procedure 1700 for generic device 1704 may be seen. Here, patterned wafer 1705 is subjected to process steps 220 to 270 of process sequence 200, whereby mismatched epitaxial material stacks 1730 may be grown on elevated substrate regions 1710. Wafer 1705 may then be flipped over and the bonded in a low-temperature wafer bonding process to CMOS-processed wafer 1740. Wafer 1740 may contain contact pads 1740 contacting layer stacks 1730. CMOS wafer 1740 may contain CMOS circuits fabricated on surface 1744, or on surface 1746, or on both surfaces 1744 and 1746.

In a variation of this scheme, patterning may be applied not only to wafer 1705 but also on wafer 1740. During process steps 220 to 270 of process sequence 200 mismatched epitaxial material stack 1730 grown on elevated substrate 1710 regions of wafer 1704 may then for example be p-doped. Conversely, a corresponding mismatched epitaxial material stack grown on wafer 1740 may be n-doped or vice versa. Both wafers 1705 and 1740 may be subjected to additional device processing steps 280 of process sequence 200, such as well known reactive ion etching and metallization steps, before the flipping and bonding process is being carried out in order to put specific n-doped and p-doped regions into electrical contact.

The processing sequence just described may for example be applied to the fabrication of thermoelectric generators integrated on a CMOS chip. Here, p-doped layer stacks 1730 on wafer 1705 and corresponding n-doped layer stacks on wafer 1740 may form p-n junction diodes wherein the p-side may be connected to a heat source, and the n-side to a heat sink, or vice versa. Epitaxial layer stacks 1730 may for example consist of SiGe alloys or any other material suitable for thermoelectric applications. In such an application patterned substrates 800 may contain also larger structures for example of dimensions on the order of 100 µm or even more, as long as wafer bowing and layer cracks remain on a negligible scale, since thermoelectric devices suffer less from a high TDD than for example detectors or emitters, or other active devices.

Figure 18:
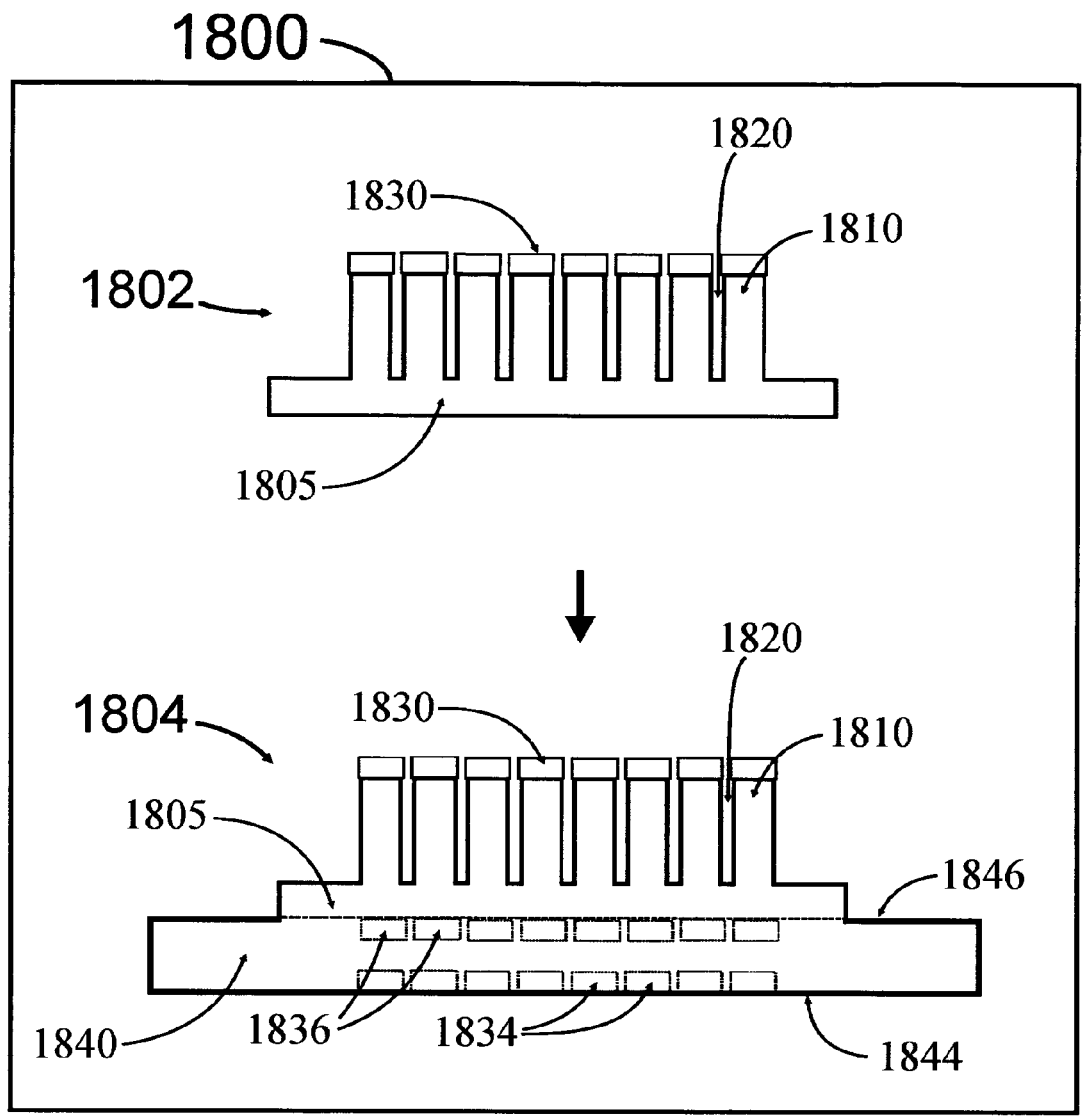
FIG. 18 is a schematic process for device fabrication by wafer bonding.

Referring now to FIG. 18, a scheme of alternative device fabrication procedure 1800 for generic device 1804 may be seen. Here, thin patterned wafer 1805 is subjected to process steps 220 to 270 of process sequence 200. Wafer 1805 may then be bonded to CMOS wafer 1840 in a low-temperature wafer bonding process. CMOS wafer 1840 may have optional contact regions 1835 aligned with active layer stacks 1830. CMOS wafer 1840 may contain CMOS circuits fabricated on surface 1844, or on surface 1846, or on both surfaces 1844 and 1846.

The patents and articles mentioned above are hereby incorporated by reference herein, unless otherwise noted, to the extent that the same are not inconsistent with this disclosure.

Other characteristics and modes of execution of the invention are described in the appended claims.

Further, the invention should be considered as comprising all possible combinations of every feature described in the instant specification, appended claims, and/or drawing figures which may be considered new, inventive and industrially applicable.

Multiple variations and modifications are possible in the embodiments of the invention described here. Although certain illustrative embodiments of the invention have been shown and described here, a wide range of modifications, changes, and substitutions is contemplated in the foregoing disclosure. While the above description contains many specifics, these should not be construed as limitations on the scope of the invention, but rather as exemplifications of one or another preferred embodiment thereof. In some instances, some features of the present invention may be employed without a corresponding use of the other features. Accordingly, it is appropriate that the foregoing description be construed broadly and understood as being given by way of illustration and example only, the spirit and scope of the invention being limited only by the claims which ultimately issue in this application.

ADDENDUM

The following US patent documents, Foreign patent documents, and Additional Publications are incorporated herein by reference thereto and relied upon:

| U.S. patent documents | | | |
|---|---|---|---|
| 2008/0308909 | A1 | December 2008 | Masahiro Sakai et al. |
| 2003/0033974 | A1 | February 2003 | Tetsuzo Ueda |
| 2008/0233716 | A1 | September 2008 | Kazuhide Abe |
| 2006/0216849 | A1 | September 2006 | Letertre et al. |
| 2008/0308909 | A1 | December 2008 | Masahiro Sakai et al. |
| 5,759,898 | | June 1998 | Ek et al. |
| 5,221,413 | | June 1993 | Brasen et al. |
| 6,537,370 | | March 2003 | Hernandez et al. |
| 6,635,110 | B1 | October 2003 | Luan et al. |
| 5,158,907 | | October 1992 | Fitzgerald |
| 2008/0001169 | A1 | January 2008 | Lochtefeld et al. |
| 2008/0149941 | A1 | June 2008 | Li et al. |
| 2009/0039361 | A1 | February 2009 | Li et al. |
| 2009/0065047 | A1 | March 2009 | Fiorenza et al. |
| 2005/0199883 | A1 | September 2005 | Borghs et al. |
| 6,380,108 | B1 | April 2002 | Linthicum et al. |
| 2007/0077670 | A1 | April 2007 | Kim et al. |
| 7,115,895 | B2 | October 2006 | von Känel |
| 5,501,893 | | March 1996 | Laermer et al. |

| Other patent documents | | | |
|---|---|---|---|
| GB2 215 514 | A | September 1989 | Goodfellow et al. |
| WO2008/030574 | A1 | March 2008 | Bai et al. |
| EP0505093 | A2 | September 1992 | Bean et al. |
| 2010/033813 | A2 | March 2010 | Fiorenza et al. |
| WO9604677 | A1 | February 1996 | von Känel et al. |
| WO2006097804 | A3 | September 2006 | von Känel |

ADDITIONAL PUBLICATIONS

V. K. Yang et al., "Crack formation in GaAs heteroepitaxial films on Si and SiGe virtual substrates", Journal of Applied Physics, vol. 93, no. 7 (Apr. 1, 2003) pp. 3859-3865.

H. Chen et al., "Low-temperature buffer layer for growth of low-dislocation-density SiGe layer on Si by molecular-beam epitaxy", Journal of Applied Physics, vol. 2 (Jan. 15, 1996) pp. 1167-1169.

E. A. Fitzgerald et al., "Epitaxial necking in GaAs grown on pre-patterned Si substrates", Journal of Electronic Materials, vol. 20, no. 10 (1991) pp. 839-853.

T. A. Langdo et al., "High quality Ge on Si by epitaxial necking", Applied Physics Letters, vol. 76, no. (Jun. 19, 2000) pp. 3700-3702.

A. E. Blakeslee, "The use of superlattices to block the propagation of dislocations in semiconductors", Materials Research Society Symposium Proceedings, vol. 148 (1989) pp. 217-227.

I. Y. Knoke, et al., "Reduction of dislocation density in GaN during low-pressure solution growth", Journal of Crystal Growth, vol. 310 (2008) pp. 3351-3357.

T. S. Zheleva et al., "Pendeo-epitaxy: A new approach for lateral growth of gallium nitride films", Journal of Electronic Materials, vol. 28, no. 4 (1999) pp. L5-L8.

S. Fündling et al., "Three-dimensionally structured silicon as a substrate for the MOVPE growth of GaN nanoLEDs", Physica Status Solidi A, vol. 206, no. 6 (Mar. 25, 2009) pp. 1194-1198.

J. G. Fiorenza et al., "Aspect ratio trapping: a unique technology for integrating Ge and III-Vs with silicon CMOS", ECS Transactions, vol 33, no. 6 (2010) pp. 963-976.

T. Stoica et al., "Interface and wetting layer effect on the catalyst-free nucleation and growth of GaN nanowires", small, vol. 4, no. 6 (2008), pp. 751-754.

R. Hammond et al., "The elimination of surface cross-hatch from relaxed, limited-area $Si_{1-x}Ge_x$ buffer layers", Applied Physics Letters, vol. 71, no. 17 (1997) pp. 2517-2519.

What is claimed is:

1. A structure comprising:
   a patterned crystalline semiconductor substrate with elevated regions bounded by trenches, wherein the depth of the trenches h is larger than their width d; and
   epitaxial semiconductor material deposited on said elevated substrate regions in the form of isolated, semiconductor patches on top of said elevated regions;
   wherein the patterned semiconductor substrate is made of a homogeneous first crystalline semiconductor material;
   wherein the epitaxial semiconductor material comprises at least one second crystalline semiconductor material having a lattice mismatch to said substrate;
   wherein said patches have a lower portion, in a proximal position with respect to said elevated regions, and upper portion, in a distal position with respect to said elevated regions;
   wherein the width of the lower portion of said patches progressively increases moving away from said elevated regions;
   wherein the upper portion of said patches has sidewalls vertical with respect to said substrate;
   wherein the vertical sidewalls of adjacent patches are spaced;
   wherein the spacing between the vertical sidewalls of adjacent patches is smaller than the width of said trenches.

2. The structure of claim 1, wherein:
   the second crystalline semiconductor material has a thermal mismatch to said substrate.

3. The structure of claim 1, wherein sidewalls and bottoms of said trenches are covered by a dielectric layer of thickness $d_{ox}$.

4. The structure of claim 1, wherein said elevated regions comprise at least one region, the boundary of which is aligned along a high-symmetry direction of said substrate.

5. The structure of claim 1, wherein the upper portion of said patches has inclined facets with respect to said vertical sidewalls.

6. The structure of claim 1, wherein the upper portion of said has horizontal surfaces with respect to said substrate.

7. The structure of claim 1, wherein said patches have widths small enough to inhibit layer cracking and wafer bowing.

8. The structure of claim 1, wherein said patches are separated by narrow gaps comprising widths in the range of about 30-300 nm.

9. The structure of claim 1, wherein said substrate is one of a group of substrates consisting of Si, SOI, Ge, GeOT, GaAs, InP, InSb, CdTe, SiC, $Al_2O_3$, AlN and GaN.

10. The structure of claim 1, wherein said epitaxial semiconductor material is one of a group of semiconductor materials, consisting of elemental group IV semiconductors and their alloys, and compound semiconductors from group III-V, group II-VI, and group IV-VI, and their alloys.

11. The structure of claim 1, wherein said epitaxial semiconductor material comprises a layer with compositional grading, said graded layer being chosen among a group of alloys consisting of an alloy of group IV, group III-V, group II-VI, and group IV-VI semiconductors.

12. The structure of claim 11, wherein said epitaxial semiconductor material comprises at least one doped layer.

13. The structure of claim 1, wherein said epitaxial semiconductor material comprises an active layer stack made from a plurality of semiconductor layers, such plurality selected from a group of semiconductor layers consisting of elemental group IV semiconductors and their alloys, and compound semiconductors from group III-V, group II-VI and group IV-VI, and their alloys.

14. The structure of claim 13, wherein at least one layer of said active layer stack is doped.

15. The structure of claim 14, wherein said active layer stack comprises an X-ray imaging detector structure.

16. The structure of claim 13, wherein said active layer stack comprises a photovoltaic solar cell.

17. The structure of claim 16, wherein said photovoltaic solar cell is a triple junction solar cell.

18. The structure of claim 17, wherein the bottom cell of said triple-junction solar cell is a Ge p-n junction solar cell.

19. The structure of claim 16, wherein said photovoltaic solar cell comprises at least three single-junction solar cells stacked to a multiple-junction solar cell.

20. The structure of claim 13, wherein said active layer stack comprises at least one high-mobility transistor structure.

21. The structure of claim 20, wherein said infrared imaging detector structure comprises pixels communicating with readout circuits of said CMOS processed semiconductor substrate.

22. The structure of claim 21, wherein said infrared imaging detector structure is made from Ge.

23. The structure of claim 21, wherein said infrared imaging detector structure is made from an InGaAs alloy.

24. The structure of claims 20, wherein said infrared X-ray imaging detector structure comprises pixels communicating with readout circuits of said processed CMOS semiconductor substrate.

25. The structure of claim 24, wherein said X-ray detector structure is made from Ge.

26. The structure of claim 13, wherein said active layer stack comprises a photonic structure, comprising at least one light-emitting diode structure, or a laser diode structure, or wherein said active layer stack comprises a structure for a thermoelectric device.

27. The structure of claim 13, wherein said active layer stack comprises an infrared imaging detector structure.

28. The structure of claim 1, wherein said semiconductor substrate is subject to a CMOS processing.

29. A semiconductor product comprising a structure of claim 1.

30. A method of forming the structure of claim 1 having closely spaced, isolated semiconductor patches on elevated regions, the method comprising the steps of:
   forming a patterned homogenous crystalline semiconductor substrate, the pattern comprising the elevated regions bounded by trenches;
   loading the substrate into an epitaxy reactor;
   epitaxially depositing said patches of at least one semiconductor material on top of said elevated regions, said semiconductor material having a lattice mismatch to said substrate, wherein epitaxially depositing said patches comprises:
   growing said semiconductor material with a vertical growth rate that is predominant with respect to the lateral growth rate of said semiconductor material by tuning the surface diffusion lengths of said semiconductor material to be smaller than the facet sizes of said patches and by reducing the reactant supply to the sidewalls of said elevated regions, exploiting the mutual shielding of the incoming flux provided by said elevated regions, so that said patches have a lower portion, in a proximal position with respect to said elevated regions, and upper portion, in a distal position with respect to said elevated regions, the width of the lower portion of said patches progressively increasing moving away from said elevated regions, the upper portion of said patches having sidewalls vertical with respect to said substrate, the vertical sidewalls of adjacent patches being spaced;
   narrowing the trenches between said semiconductor patches by epitaxial growth, so that the spacing between the vertical sidewalls of adjacent patches is smaller that the width of said trenches.

31. The method of claim 30, wherein said semiconductor material has a thermal mismatch to said substrate.

32. The method of claim 30, wherein a dielectric layer of thickness $d_{ox}$ is formed on sidewalls and bottoms of said trenches.

33. The method of claim 30, wherein said elevated substrate regions are patterned with at least one smallest dimension w within the range from 100 nm to about 500 μm.

34. The method of claim 30, wherein said elevated regions comprise at least one region, the boundary of which is aligned along a high-symmetry direction of said substrate.

35. The method of claim 30, wherein epitaxial growth conditions are tuned during growth, thereby favouring inclined facets to form on the upper portion of said patches, and thereby deflecting vertical defects into oblique directions, whereby said defects may exit through sidewalls of said spaced patches.

36. The method of claim 30, wherein patches are grown to widths small enough to inhibit layer cracking and wafer bowing.

37. The method of claim 30, wherein forming said patches comprises the formation of narrow channels separating said patches, said narrow channels comprising widths in the range of about 30-300 nm.

38. The method of claim 30, wherein said substrate is one of a group of substrates consisting of Si, SOI, Ge, GeOT, GaAs, InP, InSb, CdTe, SiC, $Al_2O_3$, AlN and GaN.

39. The method of claim 30, wherein said epitaxially deposited semiconductor layer is one of a group of semiconductor materials, consisting of elemental group IV semiconductors and their alloys, and compound semiconductors from group III-V, group II-VI, and group IV-VI, and their alloys.

40. The method of claim 30, wherein said epitaxially deposited semiconductor layer comprises a layer with compositional grading, said graded layer being chosen among a group of alloys consisting of an alloy of group IV, group III-V, group II-VI, and group IV-VI semiconductors.

41. The method of claim 30, wherein said epitaxially deposited semiconductor layer comprises an active layer stack made from a plurality of semiconductor layers, such plurality selected from a group of semiconductor layers consisting of elemental group IV semiconductors and their alloys, and compound semiconductors from group III-V, group II-VI and group IV- VI, and their alloys.

42. The method of claim 41, wherein at least one layer of said active layer stack is doped.

43. The method of claim 41, further comprising the formation of a photovoltaic solar cell structure.

44. The method of claim 43, wherein said photovoltaic solar cell structure is a triple junction solar cell.

45. The method of claim 44, wherein a Ge p-n junction solar cell is formed as the bottom cell of said triple-junction solar cell.

46. The method of claim 43, wherein said photovoltaic cell comprises at least three single-junction solar cells stacked to a multiple-junction solar cell.

47. The method of claim 30, further comprising a CMOS processing of said semiconductor substrate.

48. The method of claim 47, wherein said infrared imaging detector structure comprises pixels communicating with readout circuits of said CMOS processed semiconductor substrate.

49. The method of claim 47, wherein said infrared X-ray imaging detector structure comprises pixels communicating with readout circuits of said processed CMOS semiconductor substrate.

50. The method of claim 49, wherein said X-ray imaging detector structure is made from Ge.

51. The method of claim 30, further comprising the formation of at least one high-mobility transistor structure.

52. The method of claim 30, further comprising the formation of a photonic structure, comprising at least one light-emitting diode structure, or a laser diode structure, or further comprising the formation of a structure for a thermoelectric device.

53. The method of claim 30, further comprising the formation of an infrared imaging detector structure.

54. The method of claim 53, wherein the imaging detector structure is formed from a Ge layer.

55. The method of claim 53, wherein the imaging detector structure is formed from a InGaAs alloy layer.

56. The method of claim 30, further comprising the formation of an X-ray imaging detector structure.

\* \* \* \* \*